US012765325B2

(12) United States Patent
Yasui et al.

(10) Patent No.: US 12,765,325 B2
(45) Date of Patent: Oct. 13, 2026

(54) PROCESSOR SYSTEM, SEMICONDUCTOR INSPECTION SYSTEM, AND PROGRAM

(71) Applicant: Hitachi High-Tech Corporation, Tokyo (JP)

(72) Inventors: Kenji Yasui, Tokyo (JP); Mayuka Osaki, Tokyo (JP); Hitoshi Namai, Tokyo (JP); Yuki Ojima, Tokyo (JP); Wataru Nagatomo, Tokyo (JP); Masami Ikota, Tokyo (JP); Maki Kimura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 692 days.

(21) Appl. No.: 18/065,698

(22) Filed: Dec. 14, 2022

(65) Prior Publication Data

US 2023/0230886 A1 Jul. 20, 2023

(30) Foreign Application Priority Data

Jan. 14, 2022 (JP) ................................ 2022-004104

(51) Int. Cl.
*H10P 74/20* (2026.01)
*G06T 1/00* (2006.01)
*G06T 7/50* (2017.01)

(52) U.S. Cl.
CPC .......... *H10P 74/203* (2026.01); *G06T 1/0007* (2013.01); *G06T 7/50* (2017.01); *G06T 2207/30148* (2013.01)

(58) Field of Classification Search
None
See application file for complete search history.

(56) References Cited

U.S. PATENT DOCUMENTS 7,816,062 B2 10/2010 Nagatomo et al.
8,356,260 B2 1/2013 Nagatomo et al.
(Continued)

FOREIGN PATENT DOCUMENTS

JP 2007-129059 A 5/2007
JP 2007-227618 A 9/2007
(Continued)

OTHER PUBLICATIONS

Taiwanese Office Action issued in corresponding TW Application No. 111148889 with English translation, dated Dec. 25, 2023 (5 pages).
(Continued)

*Primary Examiner* — Matthew G Marini
(74) *Attorney, Agent, or Firm* — Foley & Lardner LLP

(57) ABSTRACT

To provide a technique capable of quantitatively grasping a change in three-dimensional shape including a cross-sectional shape of a pattern within a surface of a wafer or between wafers in a non-destructive manner before cross-sectional observation. A processor system of a semiconductor inspection system acquires images captured by an electron microscope (SEM) for a sample (S102), calculates, for a reference region defined on a surface of the sample, first feature data corresponding to each of a plurality of locations in the reference region from the captured image (S103A), calculates a first statistical value based on the first feature data at the plurality of locations (S103B), calculates, for each of a plurality of evaluation regions defined as points or regions on the surface of the sample in correspondence with the reference region, second feature data corresponding to each of one or more locations in the evaluation region from the captured image, as feature data of the same type as the first feature data (S104A), and converts the second feature
(Continued)

data using the first statistical value to obtain second feature data after conversion (S105).

11 Claims, 19 Drawing Sheets

(56) References Cited

U.S. PATENT DOCUMENTS

| | | | |
|---|---|---|---|
| 9,305,744 B2 | 4/2016 | Ohashi et al. | |
| 11,211,226 B2 | 12/2021 | Yokosuka et al. | |
| 2007/0105243 A1* | 5/2007 | Nagatomo | H01L 22/12 257/E21.53 |
| 2007/0114398 A1 | 5/2007 | Miyamoto et al. | |
| 2007/0198955 A1* | 8/2007 | Nagatomo | G06V 20/588 716/100 |
| 2017/0160074 A1 | 6/2017 | Mossavat et al. | |
| 2017/0255738 A1 | 9/2017 | Van Leest et al. | |
| 2020/0321189 A1* | 10/2020 | Yokosuka | G03F 7/70625 |
| 2022/0230842 A1 | 7/2022 | Sun et al. | |

FOREIGN PATENT DOCUMENTS

| | | |
|---|---|---|
| TW | 201329420 A | 7/2013 |
| TW | 202042321 A | 11/2020 |
| TW | 202105441 A | 2/2021 |

OTHER PUBLICATIONS

Japanese Office Action issued in corresponding JP Patent Application No. 2022-004104, dated Mar. 18, 2025 with English translation (8 pages).

* cited by examiner

TOP-VIEW SEM IMAGE

CROSS-SECTIONAL SHAPE OF SEMICONDUCTOR PATTERN

SIGNAL WAVEFORM

FIG. 10

| WAFER | REFERENCE REGION | EVALUATION REGION | SEM IMAGE | SIGNAL WAVEFORM | FEATURE DATA | STATISTICAL VALUE | INDEX | ... |
|---|---|---|---|---|---|---|---|---|
| W001 | R1 | – | g1 | ... | F1 | μ1,σ1 | – | ... |
| W001 | – | E1 | g2 | ... | F2 | μ2 | I2 | ... |
| W001 | – | E2 | g3 | ... | F3 | μ3 | I3 | ... |
| ... | ... | ... | ... | ... | ... | ... | ... | ... |

WAFER DISTRIBUTION OF CROSS-SECTIONAL SHAPE INDEX A

CROSS-SECTIONAL SHAPE INDEX A

MAP REPRESENTING SELECTED CROSS-SECTIONAL OBSERVATION REGION

CROSS-SECTIONAL SHAPE INDEX A

*FIG. 17*

AUXILIARY MAP FOR SELECTING CROSS-SECTIONAL OBSERVATION REGION

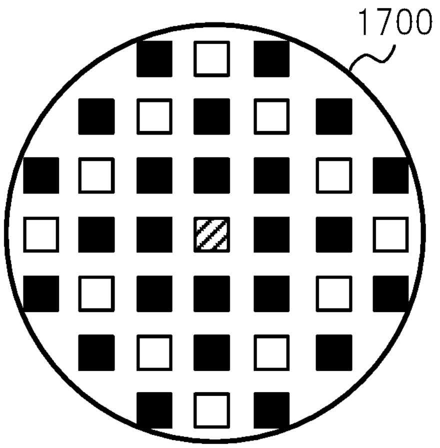

■ CROSS-SECTIONAL OBSERVATION CANDIDATE REGION IN WHICH CHANGE EQUAL TO OR GREATER THAN LOCAL SHAPE VARIATION IS OBSERVED WITH RESPECT TO REFERENCE OBSERVATION REGION (FIRST TYPE CANDIDATE REGION)

□ CROSS-SECTIONAL OBSERVATION CANDIDATE REGION IN WHICH ONLY CHANGE EQUAL TO OR SMALLER THAN LOCAL SHAPE VARIATION IS OBSERVED WITH RESPECT TO REFERENCE OBSERVATION REGION (SECOND TYPE CANDIDATE REGION)

▨ REFERENCE OBSERVATION REGION

PROCESSOR SYSTEM, SEMICONDUCTOR INSPECTION SYSTEM, AND PROGRAM

BACKGROUND OF THE INVENTION

1. Field of the Invention

The present invention relates to a technique of a semiconductor inspection system or the like.

2. Description of Related Art

In the related art, there is known a method of breaking a sample such as a semiconductor, observing a shape of a fracture surface using a cross-sectional observation device, measuring a cross-sectional dimension, and grasping a change in cross-sectional dimension.

For example, JP2007-129059A (PTL 1) describes a technique capable of measuring a cross-sectional shape, processing conditions, or device characteristics of a target evaluation pattern in a non-destructive manner by a semiconductor device manufacturing process monitoring apparatus or the like. In PTL 1, image feature data effective for estimating the cross-sectional shape of the pattern is calculated from an SEM image of the pattern. In PTL 1, the image feature data is collated with learning data (an estimation model) which is stored in advance in a database and in which the cross-sectional shape or the like of the pattern and the image feature data calculated from the SEM image are associated. PTL 1 discloses that the cross-sectional shape, the processing conditions, or the device characteristics of the target evaluation pattern are estimated in this way.

CITATION LIST

Patent Literature

PTL 1: JP2007-129059A

SUMMARY OF THE INVENTION

As an example of a semiconductor manufacturing process, for example, the following control is performed in optimization of an etching process for forming a semiconductor circuit pattern. Processing conditions are adjusted such that a three-dimensional shape of a pattern becomes a desired shape in the vicinity of a center of a wafer to be processed. Thereafter, the processing conditions are adjusted such that a shape is uniform across the entire wafer. In the example of the related art, a representative width of the pattern in the three-dimensional shape is measured based on a Top-view image captured by a scanning electron microscope (SEM), and adjustment is performed such that the measured value is made uniform. The Top-view image is an image obtained by capturing an image of a surface (in other words, an upper surface) of the wafer from an upper side. Specifically, an image-capturing direction for the image is basically a direction perpendicular to the surface of the wafer, and may also be a direction (a tilt direction and the like) oblique to the perpendicular.

On the other hand, with the miniaturization of the semiconductor circuit pattern, not only the representative line width of the semiconductor pattern but also the three-dimensional cross-sectional shape significantly affects the device characteristics. The cross-section is taken in a plane basically perpendicular to an in-plane direction of the surface of the wafer in the Top-view image. Accordingly, it is required to grasp a change in three-dimensional shape including a cross-sectional shape of the semiconductor pattern on the surface of the wafer. The change means that, when the uniformity of the pattern within the surface of the wafer or between wafers is ideal, the cross-sectional shape varies or differs in the in-plane direction of the wafer or between wafers, for example.

When a cross-sectional observation and a cross-sectional measurement are performed in the cross-sectional observation device, since it is necessary to prepare a sample for the cross-sectional observation in which a cross-section is exposed by applying destruction such as focused ion beam (FIB) processing to the sample, the cost is high. Therefore, it is difficult to perform the cross-sectional observation at many locations at which the surface of the wafer can be comprehensively evaluated. In order to efficiently grasp a change in cross-sectional shape at low cost, it is necessary to appropriately select necessary cross-sectional observation locations on the surface of the wafer. Depending on how to determine the cross-sectional observation locations, a change in cross-sectional shape may be missed. Depending on how to determine the cross-sectional observation locations, a plurality of similar cross-sectional shape locations may be redundantly observed inefficiently.

In the case of PTL 1, the cross-sectional shape is estimated and measured by learning the relation between the cross-sectional shape (for example, dimension) and the image feature data in advance. In order to ensure the accuracy of estimation and measurement, learning data covering variations in the actual cross-sectional shape is required. However, it is difficult to appropriately determine the cross-sectional shape acquisition location of learning data from a sample whose variation is unknown.

An object of the present disclosure is to provide a technique that is related to a technique of such as inspection, observation, measurement, and evaluation of a semiconductor which is a sample, and is capable of quantitatively grasping a change in three-dimensional shape including a cross-sectional shape of a pattern within a surface of a wafer or between wafers in a non-destructive manner before a cross-sectional observation.

A representative embodiment of the present disclosure includes the following configuration. A processor system according to an embodiment is a processor system for evaluating a three-dimensional shape including a cross-sectional shape of a pattern of a semiconductor which is a sample, the processor system includes at least one processor; and at least one memory resource. The processor is configured to: acquire one or more images captured by an electron microscope for each of one or more samples; calculate, for a reference region defined on each of surfaces of the one or more samples, first feature data corresponding to each of a plurality of locations in the reference region from the captured image; calculate a first statistical value based on the first feature data at the plurality of locations; calculate, for each of a plurality of evaluation regions defined as points or regions on each of the surfaces of the one or more samples in correspondence with the reference region, second feature data corresponding to each of one or more locations in the evaluation region from the captured image, as feature data of the same type as the first feature data; and convert the second feature data by using the first statistical value to obtain second feature data after conversion.

According to the representative embodiment of the present disclosure, by using the technique of such as inspection, observation, measurement, and evaluation of a semiconductor which is a sample, it is possible to quantitatively grasp a change in three-dimensional shape including a cross-sectional shape of a pattern within a surface of a wafer or between wafers in a non-destructive manner before the cross-sectional observation. Problems, configurations, effects, and the like other than those described above are shown in the embodiments for carrying out the invention.

BRIEF DESCRIPTION OF THE DRAWINGS

FIG. 10 is a diagram showing an example of a data and information table in which the image feature data and the cross-sectional shape index are associated according to the first embodiment;

FIG. 17 is a diagram illustrating an auxiliary map for determining the cross-sectional observation region in the second embodiment;

DESCRIPTION OF EMBODIMENTS

Figure 1:
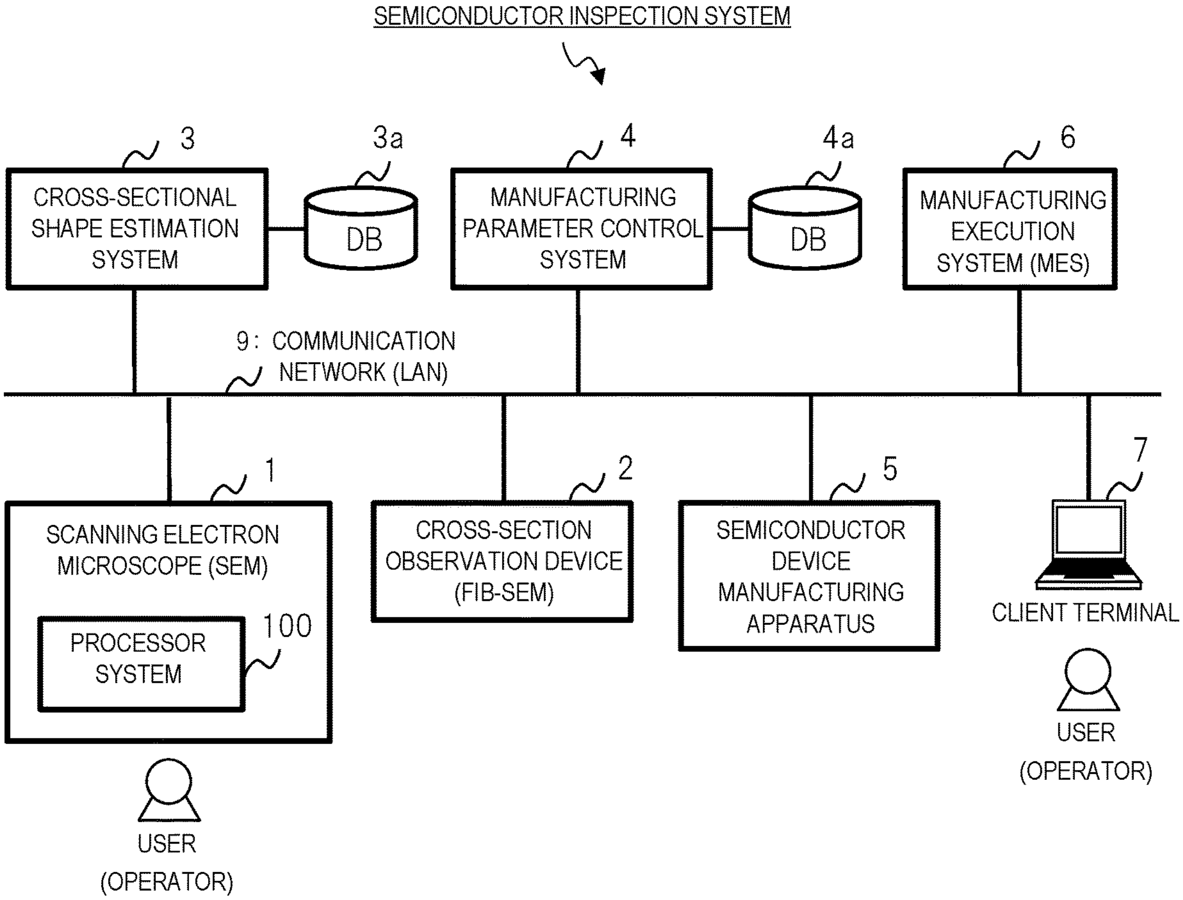
FIG. 1 shows a configuration example of a system including a semiconductor inspection system according to a first embodiment.

Hereinafter, embodiments of the present disclosure will be described in detail with reference to the drawings. In all the drawings, the same parts are denoted by the same reference numerals in principle, and a repeated description thereof will be omitted. In order to facilitate understanding, in the drawings, a representation of the component may not represent an actual position, a size, a shape, a range, and the like.

For the purpose of description, when processing performed by a program is described, the description may be made with a program, a function, a processing unit, or the like as a subject. However, a subject serving as hardware of the program, the function, the processing unit, or the like is such as a processor, or a controller, a device, a computer, a system, or the like including the processor. The computer appropriately uses resources such as a memory and a communication interface and performs processing corresponding to a program read onto the memory by the processor. Accordingly, predetermined functions, processing units, and the like are implemented. The processor is implemented by, for example, a semiconductor device such as a CPU or a GPU. The processor includes a device or a circuit capable of performing a predetermined calculation. The processing is not limited to processing performed by a software program, and can be performed by a dedicated circuit. FPGA, ASIC, CPLD and the like can be applied as the dedicated circuit.

The program may be installed as data in a target computer in advance, or may be distributed as data into the target computer from a program source. The program source may be a program distribution server on a communication network, and may be a non-transient computer-readable storage medium (for example, a memory card). The program may include a plurality of modules. A computer system may include a plurality of devices. The computer system may be implemented by a client server system, a cloud computing system, an IoT system, or the like. Various types of data and information may have, for example, structures such as tables and lists, but are not limited thereto.

Identification information may be replaced with an identifier, an ID, a name, a number, or the like.

First Embodiment

A semiconductor inspection system and the like according to a first embodiment of the present disclosure will be described with reference to FIG. 1. The semiconductor inspection system according to the first embodiment includes a processor system according to the first embodiment and an electron microscope (particularly, an SEM). A program according to the first embodiment is a program for causing a processor of the processor system according to the first embodiment to perform processing.

The semiconductor inspection system according to the first embodiment, in particular, the processor system has a function of evaluating a three-dimensional shape including a cross-sectional shape of a semiconductor pattern. The system has a function of calculating and outputting an index for evaluation (in other words, feature data after conversion)

based on feature data (in other words, image feature data) calculated from an SEM image. In the first embodiment, an example is described in which a change in cross-sectional shape of a pattern on a surface of a semiconductor wafer is calculated and detected as an index using a Top-view SEM image and displayed for a user.

The semiconductor inspection system according to the first embodiment quantitatively grasps a change in cross-sectional shape within a surface of the wafer based on the feature data calculated from the Top-view SEM image. Since a change in image feature data occurs due to the change in cross-sectional shape, the possibility of the change in cross-sectional shape can be grasped by evaluating the change in image feature data on the surface of the wafer. On the other hand, the change in cross-sectional shape includes various shape changes such as a change in line width of a pattern, a change in rounding of corners, a change in tailing, a change in tilt angle of a side wall, and a change in height. It is difficult to uniquely determine the relation between these changes in cross-sectional shape and the image feature data. Therefore, it is difficult to measure a dimension (for example, a line width) of a specific cross-sectional shape based on the image feature data. In other words, in the related art, it is difficult to grasp the magnitude of the influence that the magnitude of the change in image feature data has on the change in cross-sectional shape.

Therefore, the semiconductor inspection system according to the first embodiment converts a change amount of the image feature data on the surface of the wafer into an index (also referred to as a cross-sectional shape index) obtained by normalizing the image feature data based on fluctuation of the feature data caused by a local shape variation of the semiconductor pattern. A specific example of the normalization is represented by an equation to be described later. The semiconductor inspection system according to the first embodiment calculates, from the SEM image, a statistical value (referred to as a first statistical value) of image feature data (referred to as first feature data) at a plurality of locations in a region serving as a reference, and calculates image feature data (referred to as second feature data) at a plurality of locations in a region serving as an evaluation target. Then, the semiconductor inspection system according to the first embodiment converts the second feature data in the region serving as the evaluation target by using a second statistical value of the region serving as the reference, thereby obtaining second feature data after conversion as the cross-sectional shape index. The cross-sectional shape index can be used as an index which is related to uniformity of a pattern within the surface of the wafer or between wafers and which is used for quantitatively evaluating a change in cross-sectional shape.

[System including Semiconductor Inspection System]

FIG. 1 shows an entire system including the semiconductor inspection system according to the first embodiment. The system in FIG. 1 includes a scanning electron microscope (SEM) 1, a cross-sectional observation device 2, a cross-sectional shape estimation system 3, a manufacturing parameter control system 4, a semiconductor device manufacturing apparatus 5, a manufacturing execution system (MES) 6, and a client terminal 7. These components are connected to, for example, a communication network (for example, a LAN) 9, and can communicate with one another. In the system in FIG. 1, a component mainly used in the first embodiment is the scanning electron microscope (SEM) 1. Other components are mainly used in the second and subsequent embodiments to be described later.

The semiconductor inspection system according to the first embodiment mainly includes the scanning electron microscope (SEM) 1. The SEM 1 includes a main unit to be described later (FIG. 3) and a processor system 100. The processor system 100 is a computer system that implements a main function of the semiconductor inspection system according to the first embodiment, that is, a function of calculating a cross-sectional shape index, and the like (to be described later in FIG. 2). The SEM 1 may appropriately perform communication or the like with an external device (another component). For example, the SEM 1 may refer to necessary data and information from the external device or store the necessary data and information to the external device.

The semiconductor inspection system according to the first embodiment is not limited to a configuration example in FIG. 1. For example, a portion of the processor system 100 that implements the main function of the semiconductor inspection system may be present outside the SEM 1 or may be mounted in any device of systems in FIG. 1. For example, the processor system 100 may be connected to the communication network 9 in a form of a server device or the like independently of the SEM 1.

As will be described later, the cross-sectional observation device 2 is a device having a function of performing cross-sectional processing on a semiconductor device (particularly, a wafer) and observing a cross-sectional shape thereof, and a FIB-SEM is applied in the example of the first embodiment. The cross-sectional processing is processing for destructing a part of the semiconductor device such that a structure of a cross-section of the semiconductor device is exposed and observable. The cross-sectional observation is an observation for a cross-section formed by the cross-sectional processing. The cross-sectional processing can be performed not only by the FIB-SEM but also by other types of devices. The cross-sectional observation can be performed not only by using the FIB-SEM but also by using other types of devices, for example, a cross-sectional SEM and a scanning transmission electron microscope (STEM).

The cross-sectional shape estimation system 3, which will be described later, is a system having a function of estimating a cross-sectional shape of a semiconductor device (particularly, a wafer). As the cross-sectional shape estimation system 3, for example, a system described in PTL 1 can also be applied. The cross-sectional shape estimation system 3 stores data and information for estimation, for example, data and information representing a correspondence relation between image feature data and a cross-sectional shape dimension, into a database (DB) **3*a*, for example, based on learning. The cross-sectional shape estimation system 3 uses the data and information stored in the DB 3*a*** to estimate a cross-sectional shape dimension of the semiconductor device based on the image feature data.

The manufacturing parameter control system 4, which will be described later, is a system that performs control so as to adjust a parameter (for example, an etching parameter) related to manufacturing (for example, an etching process) of the semiconductor device performed by the semiconductor device manufacturing apparatus 5 (for example, an etching device). The manufacturing parameter control system 4 may be a part of the MES 6. The MES 6 is a system that manages semiconductor device manufacturing execution using the semiconductor device manufacturing apparatus 5. The MES 6 and the like have design data and manufacturing execution management information related to the semiconductor device serving as a target.

The client terminal 7 is an information processing terminal device having a function of accessing each system (particularly, a server function among the functions) such as the SEM 1 via the communication network 9. A general PC or the like can be applied as the client terminal 7, and an input device for external input and an output device for display or the like are built in the client terminal 7, or these devices are externally connected to the client terminal 7. A user such as an operator may use each system such as the SEM 1 from the client terminal 7.

As a modification, for example, the processor system 100 or the like and the client terminal 7 may be connected via a communication network such as the Internet. For example, functions of the processor system 100 or the like may be implemented by a cloud computing system or the like.

The communication network 9 may be provided with a program distribution server (not shown). The program distribution server distributes data such as the program according to the first embodiment to, for example, the processor system 100 of the SEM 1.

[Processor System]

Figure 2:
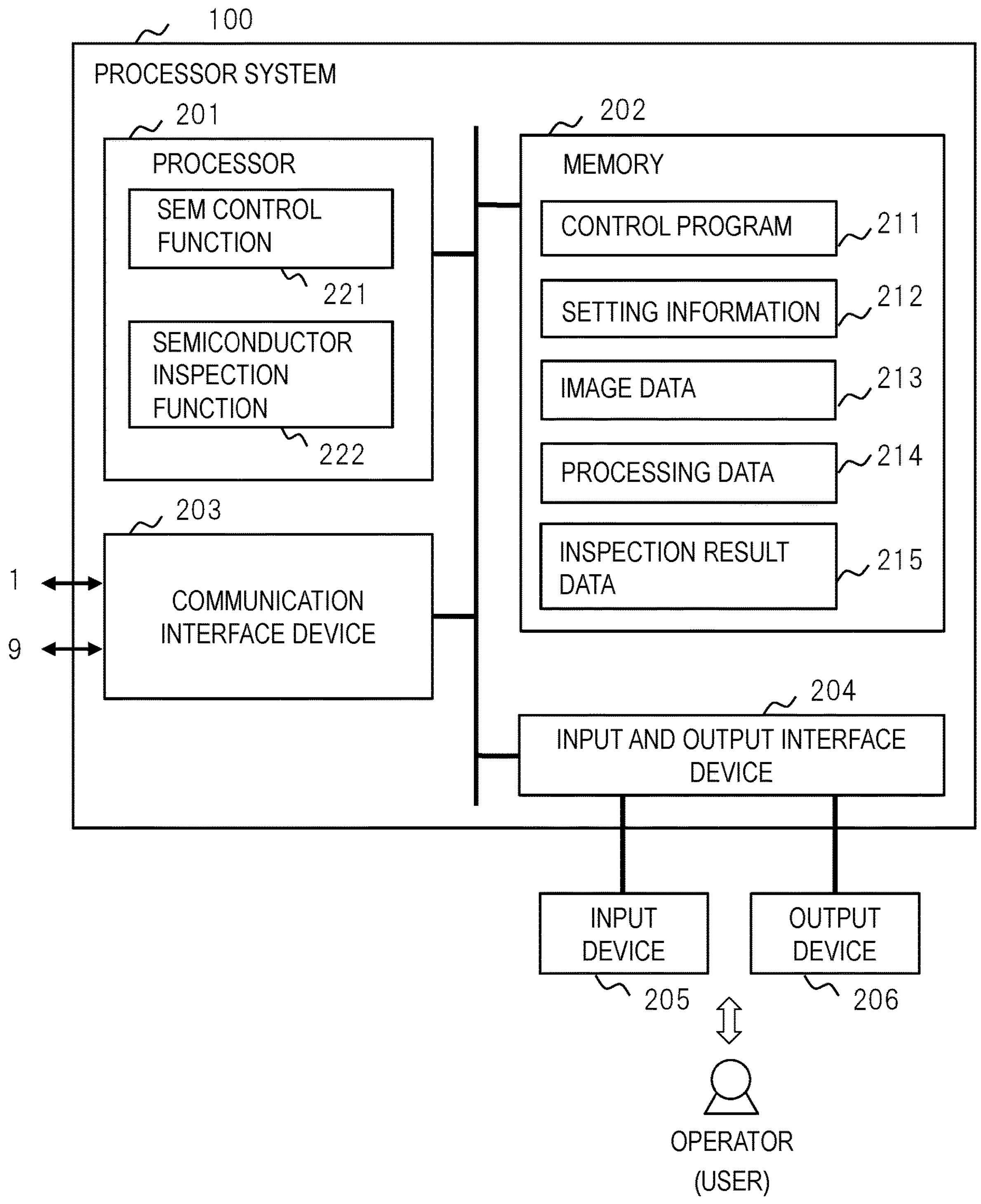
FIG. 2 shows a configuration example of a processor system according to the first embodiment.

FIG. 2 shows a configuration example of hardware and software of the processor system 100. The processor system 100 is implemented by, for example, a computer such as a control PC. The processor system 100 includes a processor 201, a memory 202, a communication interface device 203, an input and output interface device 204, and the like. These components are connected to a bus and can communicate with one another.

The processor 201 is implemented by a semiconductor device such as a CPU, an MPU or a GPU. The processor 201 includes ROM, RAM, various peripheral functions, and the like. The processor 201 performs processing corresponding to a control program 211 stored in the memory 202. Accordingly, an SEM control function 221, a semiconductor inspection function 222, and the like are implemented. The SEM control function 221 is a function of controlling the SEM 1 as a controller, but can be omitted. The semiconductor inspection function 222 is a main function of the semiconductor inspection system according to the first embodiment, and includes a function of calculating a cross-sectional shape index.

The memory 202 stores the control program 211, setting information 212, image data 213, processing data 214, inspection result data 215, and the like. By the control program 211, the semiconductor inspection function 222 and the like are implemented. The setting information 212 is system setting information or user setting information of the semiconductor inspection function 222. The image data 213 is data of a captured image acquired by the SEM 1. The processing data 214 is data generated during processing using the semiconductor inspection function 222 or the like. The inspection result data 215 is data including feature data, a cross-sectional shape index, an evaluation result, or the like that are obtained as processing results using the semiconductor inspection function 222 or the like.

The communication interface device 203 is a device including a communication interface for the SEM 1, the communication network 9, and the like. The input and output interface device 204 is a device including an input and output interface, and an input device 205 and an output device 206 are externally connected to the input and output interface device 204. Examples of the input device 205 include a keyboard and a mouse. Examples of the output device 206 include a display and a printer. The processor system 100 may include the input device 205 and the output device 206. A user, such as an operator, may use the processor system 100 through operation of the input device 205 or screen display of the output device 206. The user may use the processor system 100 by accessing the processor system 100 from the client terminal 7 in FIG. 1 through the communication network 9.

An external storage device (for example, a memory card or a disk) may be connected to the processor system 100, and input and output data of the processor system 100 may be stored in the external storage device.

When a function is used in a client-server communication form between a system such as the processor system 100 in FIG. 1 and the client terminal 7 of the user, for example, the function can be implemented as follows. The user accesses, for example, the server function of the processor system 100 of the SEM 1 from the client terminal 7. The server function of the processor system 100 is to transmit, to the client terminal 7, data such as a Web page including a graphical user interface (GUI). The client terminal 7 displays, on the display, the Web page or the like based on the received data. The user views the Web page or the like, checks information related to semiconductor inspection, and inputs settings and instructions as necessary. The client terminal 7 transmits, to the processor system 100, information input by the user. The processor system 100 performs processing related to the semiconductor inspection based on the information input by the user, and stores results. The processor system 100 transmits, to the client terminal 7, data such as a Web page including such as the processing results. The client terminal 7 displays, on the display, the Web page including such as the processing results. The user confirms such as the processing results.

[SEM]

Figure 3:
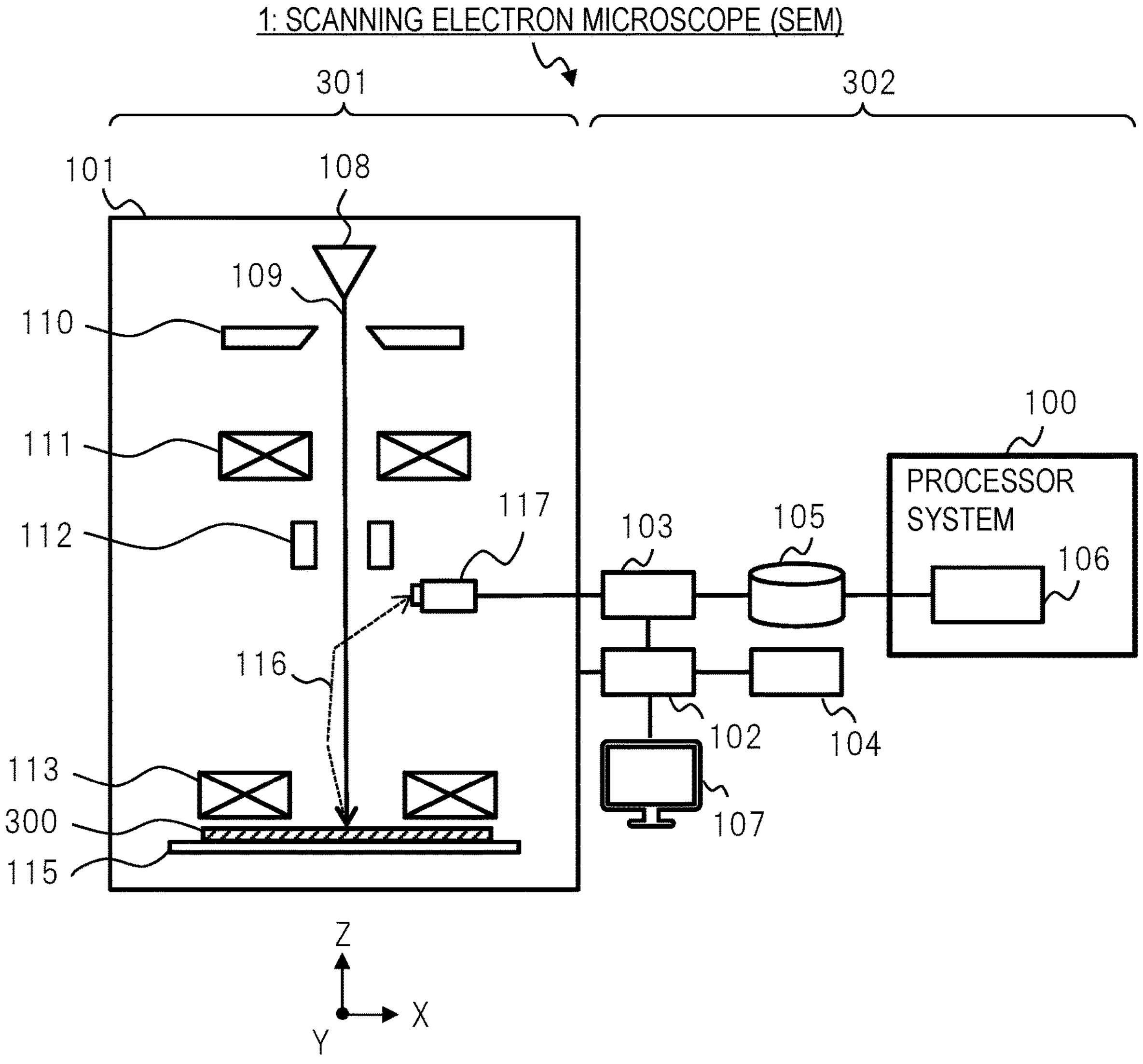
FIG. 3 shows a configuration example of a scanning electron microscope (SEM) according to the first embodiment.

FIG. 3 shows a configuration example of the SEM 1. The SEM 1 mainly includes a main unit 301 and a control unit 302 connected to the main unit 301. The main unit 301 includes an image-capturing unit 101, a driving mechanism (not shown), and the like. The control unit 302 is a part including the processor system 100 and the like. The control unit 302 includes an overall control unit 102, a signal processing unit 103, an external input unit 104, a storage unit 105, the processor system 100, a display unit 107, and the like. The processor system 100 includes an image calculation unit 106. Components such as the overall control unit 102, the signal processing unit 103, and the storage unit 105 may be integrally implemented in the processor system 100.

The image-capturing unit 101 includes an electron gun 108, an acceleration electrode 110, a converging lens 111, a deflection lens 112, an objective lens 113, a stage 115, a detector 117, and the like as components mounted on a lens barrel (in other words, a housing). The electron gun 108 emits an electron beam 109. The acceleration electrode 110 accelerates the electron beam 109 emitted from the electron gun 108. The converging lens 111 converges the electron beam 109. The deflection lens 112 deflects a trajectory of the electron beam 109. The objective lens 113 controls a height at which the electron beam 109 is converged.

The stage 115 is a sample stage on which a sample 300 (in other words, a semiconductor device or a wafer) whose image is to be captured is placed. Since the stage 115 is, for example, a mechanism capable of moving in an X direction and a Y direction shown in the drawing, and thus a field of view for capturing an image can be set.

The detector 117 detects particles such as secondary electrons 116 generated from the sample 300 irradiated with the electron beam 109.

The overall control unit 102 corresponds to a controller of the SEM 1, and controls the entire image-capturing unit 101 and each of the units. The overall control unit 102 gives, to each unit, an instruction such as drive control. The overall control unit 102 can be implemented by a computer system or a dedicated circuit. At least one of the SEM control function 221 in FIG. 2 and the overall control unit 102 may be provided. The overall control unit 102 may be controlled by the SEM control function 221.

The signal processing unit 103 converts a signal detected by the detector 117 into image data based on analog/digital conversion or the like according to the instruction from the overall control unit 102, and stores the image data into the storage unit 105. The signal processing unit 103 can be implemented by a computer system or a dedicated circuit. The storage unit 105 can be implemented by, for example, a nonvolatile storage device.

The external input unit 104 is a unit that inputs an instruction or the like to the overall control unit 102 based on an input operation of an operator, and can be implemented by a computer system, an input device, or the like. The display unit 107 is a unit that is connected to the overall control unit 102 and displays information from the overall control unit 102 for the operator, and can be implemented by a computer system, an output device, or the like.

The processor system 100 acquires image data from the storage unit 105. The image calculation unit 106 of the processor system 100 is a unit that performs processing corresponding to the semiconductor inspection function 222 in FIG. 2. The image calculation unit 106 can be implemented by program processing or the like. The image calculation unit 106 performs calculation and conversion processing of image feature data to be described later on an image of the image data (that is, a Top-view image of the SEM 1) to obtain a cross-sectional shape index calculated as feature data after conversion. The image calculation unit 106 stores the cross-sectional shape index and displays the cross-sectional shape index together with the GUI on a display screen (for example, the output device 206 in FIG. 2).

The SEM is not limited to a configuration example in FIG. 3. The SEM control function 221 in FIG. 2 and functions of the overall control unit 102 and the like in FIG. 3 may be combined into one.

[Image Feature Data]

Figure 4A:
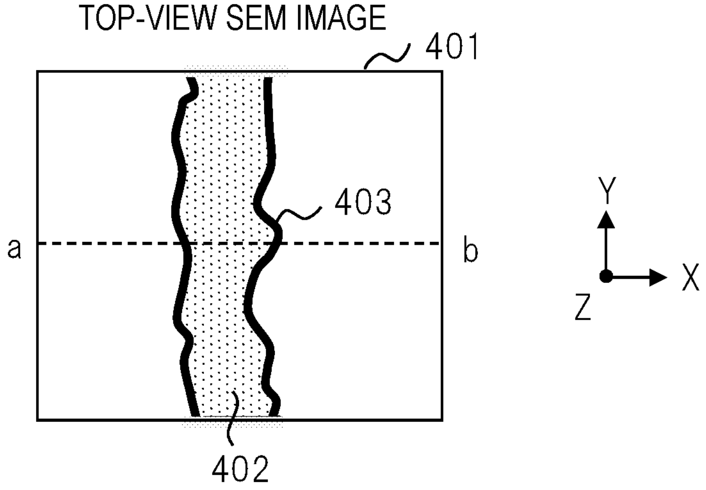
FIGS. 4A to 4C are diagrams respectively illustrating examples of a Top-view SEM image, a cross-sectional shape, and a signal waveform of a semiconductor pattern according to the first embodiment.

Next, the image feature data will be described with reference to FIGS. 4A to 4C and the like. The image feature data is an index (which is different from a cross-sectional shape index to be described later) for generally quantifying a signal waveform on the SEM image. FIG. 4A shows an example of an SEM image or the like targeting a line pattern of a semiconductor device (particularly, a wafer). FIG. 4A is an example of a Top-view image as a two-dimensional SEM image 401. The SEM image 401 includes one line pattern 402 extending, for example, in the Y direction within a shown X-Y plane corresponding to the surface of the wafer. The image which is the SEM image 401 has a pixel value (luminance or color) of a pixel at each position in a two-dimensional (X, Y) coordinate system shown in FIG. 4A.

Figure 4B:
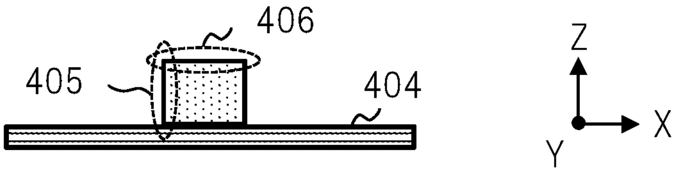

FIG. 4B is an example of a cross-sectional shape of a semiconductor pattern at a position of an a-b line in FIG. 4A, and corresponds to an X-Z cross-section. As a cross-sectional shape shown in FIG. 4B, an ideal example is shown. FIG. 4B shows a case where a side wall portion 405 of the line pattern 402 is formed vertically flat and an upper surface portion 406 is formed parallel flat with respect to an X-Y plane 404. In practice, the cross-sectional shape may have various shapes as illustrated in FIG. 1 of PTL 1. For example, the various shapes may be an inclination of a side wall, a curvature of the side wall, rounding of a corner on an upper end side of the side wall, rounding (tailing) of a corner on a lower end side of the side wall, protrusion of the corner on the upper end side of the side wall.

Figure 4C:
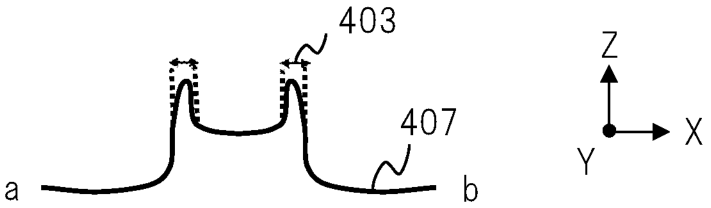

FIG. 4C shows an example of a signal waveform 407 corresponding to the image in FIG. 4A and the cross-sectional shape in FIG. 4B, which corresponds to a so-called line profile. The signal waveform 407 is formed by image signals extracted from the SEM image 401 in FIG. 4A in a direction from a to b as a direction (X direction) perpendicular to the line pattern 402.

In general, a signal amount of a signal waveform such as the signal waveform 407 changes with high sensitivity with respect to a tilt angle of a measurement target, and a signal amount at a side wall portion (for example, the side wall portion 405) of the pattern is larger than a signal amount at a flat portion (for example, the upper surface portion 406) of the pattern. Therefore, the signal amount at the side wall portion of the pattern is absolutely large, and a region called a white band (also referred to as WB) 403 appears on the signal waveform 407. Thus, the signal amount of the signal waveform 407 changes according to the cross-sectional shape of the pattern.

Figure 5A:
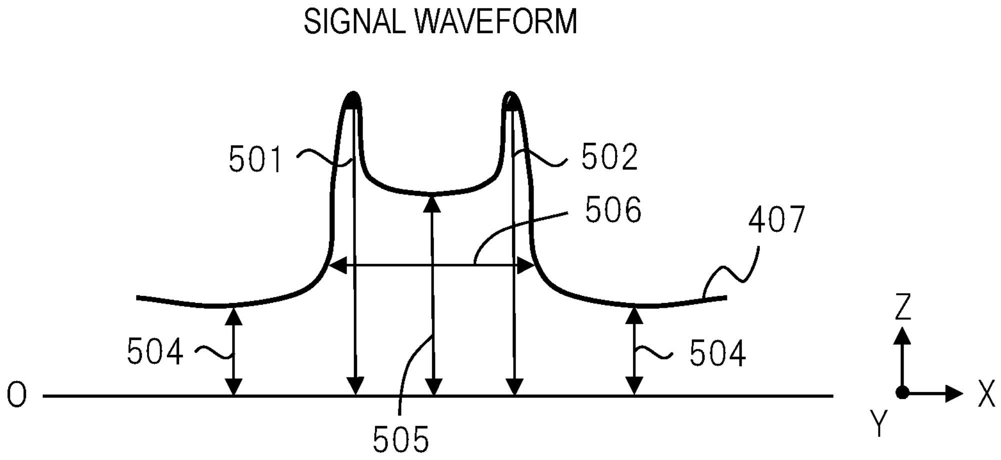
FIGS. 5A and 5B are diagrams illustrating image feature data according to the first embodiment.
Figure 5B:
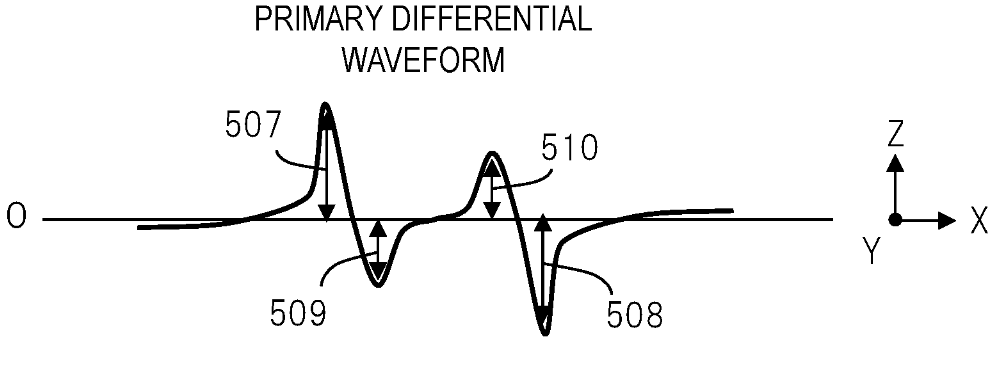

FIGS. 5A and 5B show examples of the image feature data. FIG. 5A shows details of the signal waveform 407, and FIG. 5B shows a primary differential waveform of the signal waveform 407. In this example, the signal waveform 407 of FIG. 5A has left and right white band peaks 501 and 502, left and right bottom signal amounts 503 and 504, a top signal amount 505, and a line profile width 506 (in other words, a line width) as image feature data. There are inclinations 507, 508, 509, and 510 as image feature data calculated from the primary differential waveform in FIG. 5B. These image feature data are various values that quantitatively express features of the signal waveform.

In general, it is considered that feature data indicating the signal amount of the signal waveform (for example, WB peak 501) is used to grasp a change in height direction of the pattern (corresponding cross-section), feature data indicating a width of the signal waveform (for example, the width 506) is used to grasp a change in width direction such as the line width of the cross-sectional shape, and feature data indicating an inclination of the signal waveform (for example, the inclination 507) is used to grasp changes in the rounding and the tailing of corner of the pattern, the tilt angle of the side wall, or the like.

The semiconductor inspection system according to the first embodiment uses the feature data of one or more types to calculate a cross-sectional shape index for each type of feature data.

[Processing Flow (1-1)]

Figure 6:
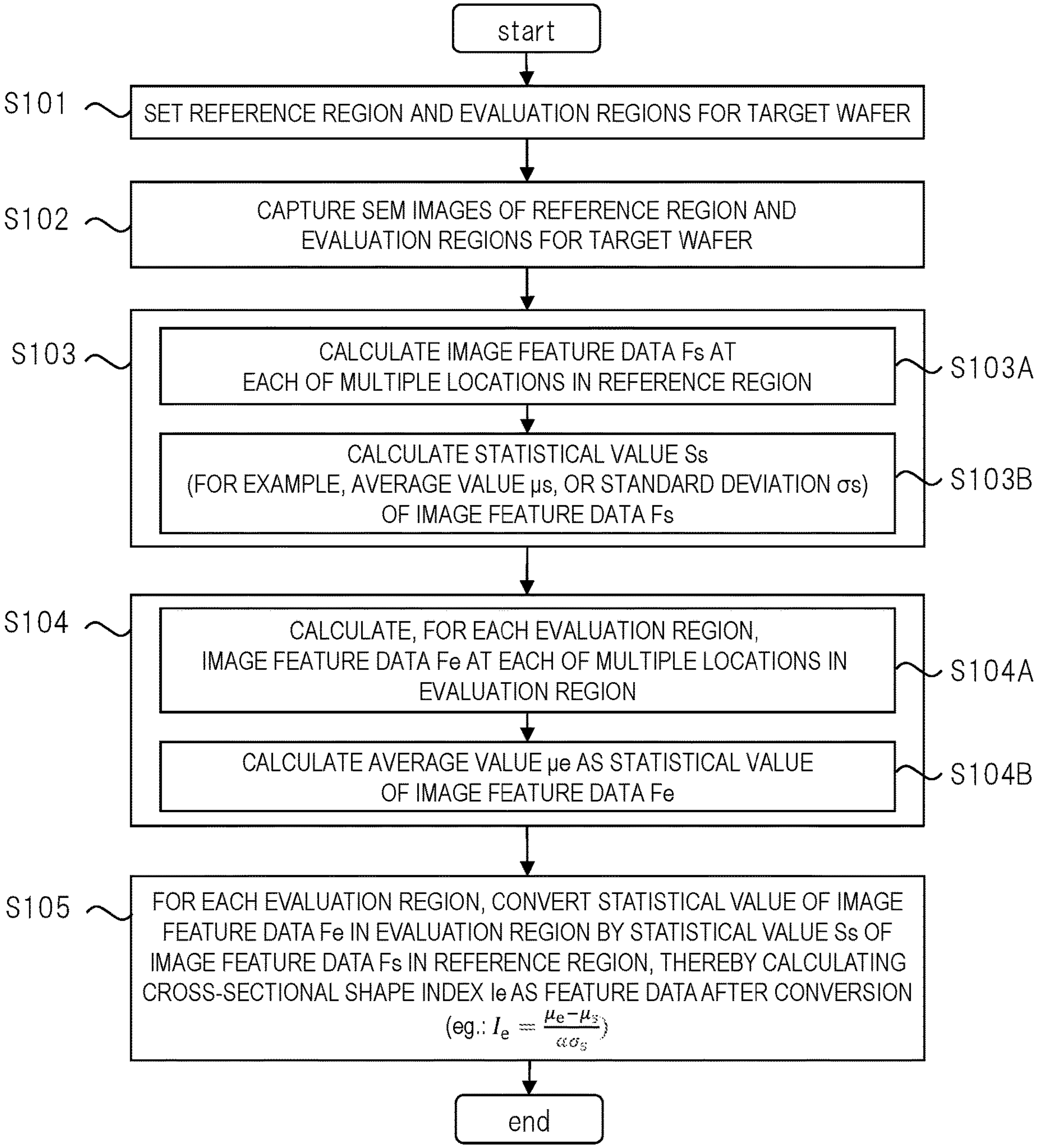
FIG. 6 is a diagram showing a processing flow according to the first embodiment.

Next, a main processing flow of the semiconductor inspection system according to the first embodiment will be described with reference to FIG. 6. FIG. 6 is a processing flow performed by the processor system 100. The processing flow includes a processing step of quantifying a change in cross-sectional shape of a pattern on the surface of the wafer using the SEM 1 and one or more types of the image feature data (501 to 510) in FIGS. 5A and 5B. In the present processing flow, by normalizing the image feature data based on the fluctuation of the image feature data caused by the local shape variation of the semiconductor pattern, the image feature data is converted into a cross-sectional shape index.

In step S101, the processor system 100 sets a reference region and evaluation regions on a surface of a target wafer based on the external input unit 104 (or the input device 205 in FIG. 2 or the client terminal 7 in FIG. 1, which applies hereinafter) of the SEM 1. The evaluation region is a region serving as an evaluation target, and the reference region is a region serving as a reference for evaluating the evaluation region.

[Reference Region and Evaluation Region]

Figure 7:
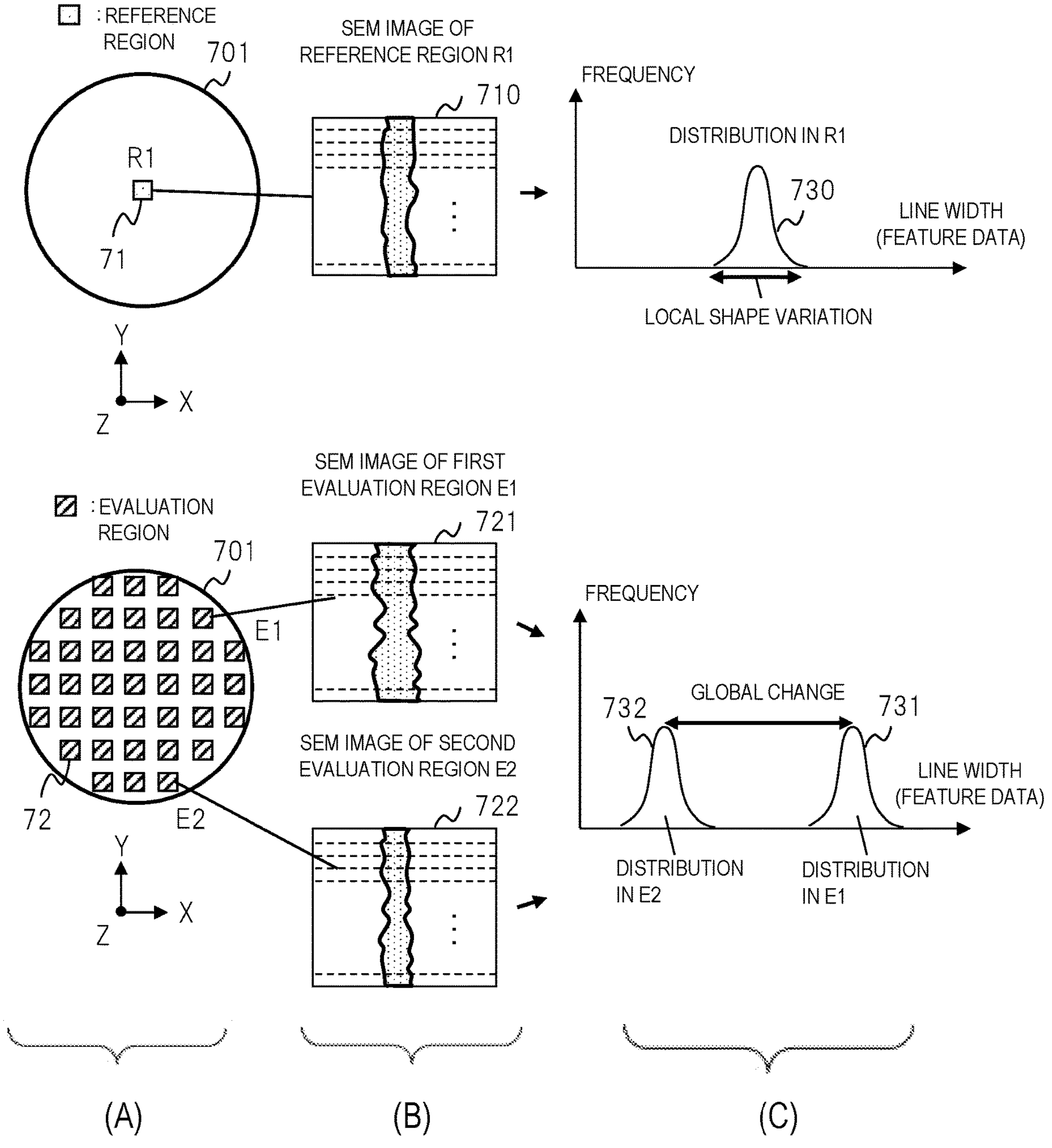
FIG. 7 is a diagram illustrating an example of a reference region and evaluation regions according to the first embodiment.

FIG. 7 shows an example of the reference region and the evaluation regions. (A) of FIG. 7 shows an example of definition and setting of a reference region 71 and evaluation regions 72 on a surface (X-Y plane) of a certain target wafer 701. (B) of FIG. 7 shows an enlarged image of the example of the reference region 71 and the evaluation regions 72. (C) of FIG. 7 shows an example of a distribution map of feature data in the reference region 71 and an example of a distribution map of feature data in the evaluation regions 72.

As shown in (A) of FIG. 7, as the evaluation region 72, a plurality of target regions for evaluating a change in global cross-sectional shape are set on the surface of the wafer 701. In (A) of FIG. 7, each evaluation region 72 is shown as a rectangular region having a small oblique line pattern, and the reference region 71 is shown as a rectangular region having a small dot pattern. The evaluation region 72 is set for each chip, for example. On the surface of the wafer 701, chip regions (not shown) are generally formed repeatedly in a grid pattern. The evaluation region 72 and the reference region 71 may be set for each chip region. The evaluation region 72 and the reference region 71 may not have the same size and shape as the chip region. In this example, on the surface of the wafer 701, a plurality of evaluation regions 72 are set at regular intervals in the X direction and the Y direction, but the invention is not limited thereto.

The evaluation region 72 and the reference region 71 are set as two-dimensional regions of a set size in order to take a plurality of locations as samples in one region. The evaluation region 72 or the reference region 71 may be set at a region having a size including a pattern shape (for example, at least one line pattern) such that feature data in the region can be calculated. As a modification, the evaluation region 72 is not limited to a two-dimensional region, and may be set as one point according to a calculation formula of the cross-sectional shape index.

The reference region 71 is set as a reference (in other words, a reference for normalization) for comparison with the image feature data of each evaluation region 72. From this viewpoint, a region in which a pattern relatively close to an ideal shape is assumed to be formed is selected as the reference region 71. In this example, the reference region 71 is set at a center of the wafer 701. The reference region 71 is not limited thereto, and may be set at any position other than the center.

As in the example of (A) of FIG. 7, in one or more target samples (in this example, one wafer 701), the reference region 71 and the plurality of evaluation regions 72 are defined in correspondence. In this example, the evaluation region 72 at the center of the wafer 701 overlaps the reference region 71 at the center of the wafer 701. Even if the evaluation region 72 and the reference region 71 overlap, calculation of the index has no problem. The reference region 71 and the evaluation region 72 are not limited to this example, and the user can set the reference region 71 and the evaluation region 72 on the display screen as desired.

In the example of (B) of FIG. 7, an SEM image 710 of a reference region R1 serving as one reference region 71 is shown, two evaluation regions 72 include a first evaluation region E1 and a second evaluation region E2, and an SEM image 722 of the first evaluation region E1 and an SEM image 722 of the second evaluation region E2 are shown. Each of the images is a part of the Top-view image. Any region of the SEM image 710 or the like includes a line pattern similar to that in FIG. 4A. In each region of the SEM image 710 or the like, a plurality of locations for calculating certain feature data (for example, a line width 506 in FIG. 5A) can be taken as samples, as indicated by broken lines. In this example, the plurality of locations (samples) are a plurality of straight lines corresponding to a direction perpendicular to the line pattern (in other words, an X-Z plane that allows the cross-sectional observation).

As shown in the example of the SEM images 710, 721, and 722 in (B) of FIG. 7, the semiconductor pattern has a local shape variation. The line pattern in each region in (B) of FIG. 7 has a line width that varies at each location in the Y direction and is not uniform. Such a local shape variation occurs depending on details of manufacturing of a semiconductor.

(C) of FIG. 7 shows a frequency distribution of a line width (the line width 506 in FIG. 5A) as an example of feature data obtained from the SEM image of each region in (B) of FIG. 7. In other words, the frequency distribution is statistics of a plurality of samples in a local region. As shown in (C) of FIG. 7, for example, the line widths of the line pattern have variations close to a normal distribution. A distribution 730 is a frequency distribution of line widths obtained based on the SEM image 710 in the reference region R1. The distribution 730 represents a local shape variation. A distribution 731 is a frequency distribution of line widths obtained based on the SEM image 721 in the first evaluation region E1, and a distribution 732 is a frequency distribution of line widths obtained based on the SEM image 722 in the second evaluation region E2. As shown in (C) of FIG. 7, the two distributions 731 and 732 have a global change (a change greater than a local change), which corresponds to a change in cross-sectional shape within the surface of the wafer 701.

In the first embodiment, a change in image feature data within the surface of the wafer or between wafers is quantified based on the fluctuation of the image feature data caused by the local shape variation of the pattern shape of the wafer. Therefore, a range of the reference region 71 (in other words, an image size) is set such that the local shape variation can be statistically evaluated with sufficient accuracy. In the specific example, as shown in (B) of FIG. 7, the range of the reference region 71 is set to include at least one line pattern. At the same time, a range of each evaluation region 72 of the plurality of evaluation regions 72 is set to include at least one line pattern, in association with the range of the reference region 71.

[Processing Flow (1-2)]

With reference to FIG. 6 again, in step S102, the processor system 100 (or the overall control unit 102) controls the SEM 1 to capture Top-view SEM images of the reference region 71 and the evaluation regions 72 for the target wafer.

Step S103 includes steps S103A and S103B. First, in step S103A, the processor system 100 calculates feature data (also referred to as first feature data) from the SEM image of the reference region 71. In the first embodiment, the feature data is one type of feature data defined in advance. An example of the feature data is the above-described line width (the line width 506 in FIG. 5A). The feature data to be used here may be specified or set by the user on the display screen. The processor system 100 calculates feature data of each location of the plurality of locations in the reference region 71. The feature data (the first feature data) of the reference region 71 is defined as feature data Fs.

In Step S103B, the processor system 100 calculates a predetermined statistical value (also referred to as a first statistical value) based on the feature data Fs. The statistical value (the first statistical value) of the reference region 71 is defined as a statistical value Ss.

[Calculation of Feature Data and the Like]

Figure 8A:
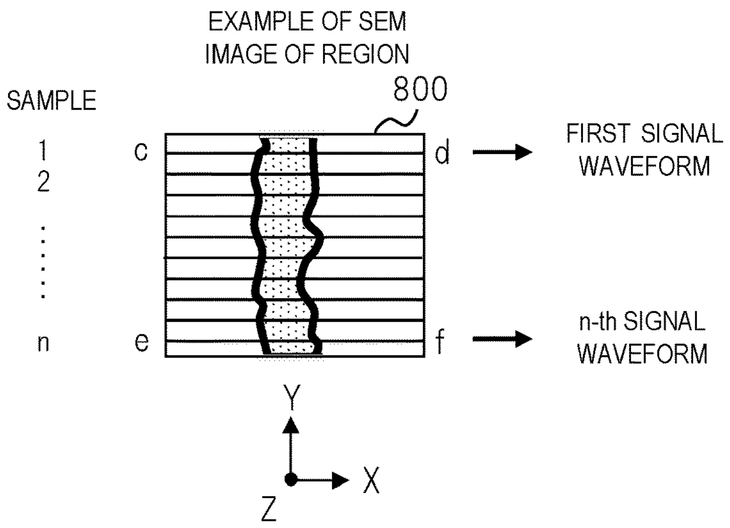
FIGS. 8A to 8C are diagrams illustrating processing for calculating fluctuation of feature data caused by a local shape variation in the reference region according to the first embodiment.
Figure 8B:
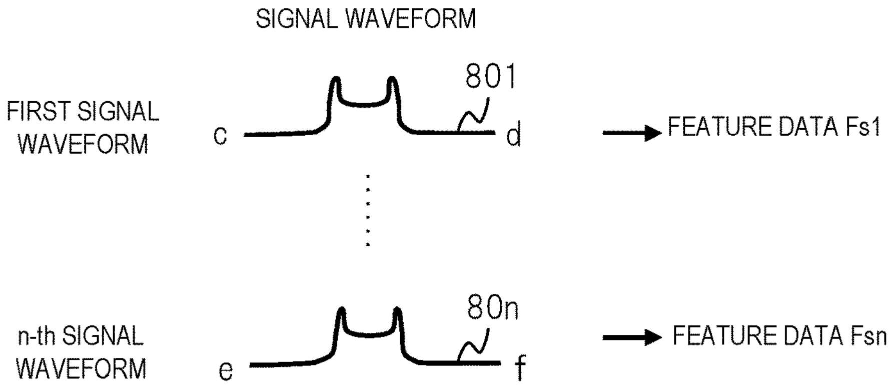
Figure 8C:
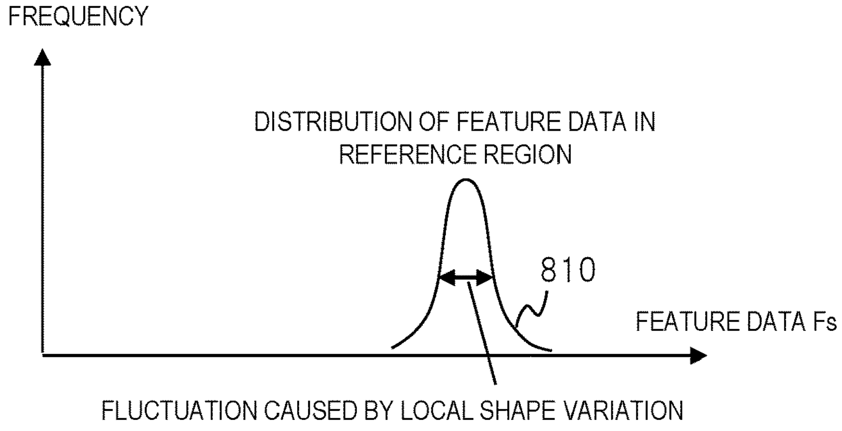

FIGS. 8A to 8C are diagrams illustrating calculation of the feature data and the like. FIG. 8A shows an example of an SEM image of a region (the reference region 71 or the evaluation region 72, for example, the reference region 71). An SEM image 800 in this example is the same as the SEM image 401 in FIG. 4A and the SEM image 710 in (B) of FIG. 7. FIG. 8B shows an example of signal waveforms at a plurality of locations in the region. FIG. 8C shows a frequency distribution of a plurality of pieces of feature data calculated from the plurality of signal waveforms.

As shown in FIG. 8B, the processor system 100 calculates, for example, signal waveforms at locations of a plurality of positions (samples) in an image of the reference region 71 in a direction perpendicular to a line pattern in the image (the X-Z plane whose cross-sectional shape can be observed). In FIG. 8A, a plurality of (n) samples in the reference region 71 are shown as 1 to n. For example, a sample 1 corresponds to an X-Z cross-section taken along a c-d line in FIG. 8A, and a sample n corresponds to an X-Z cross-section taken along an e-f line in FIG. 8A. The signal waveforms at the plurality of (n) locations are defined as a first signal waveform to an n-th signal waveform.

In FIG. 8B, the plurality of (n) signal waveforms are shown as signal waveforms 801 to 80*n*. The processor system 100 calculates image feature data for each signal waveform of each sample (step S103A). In FIG. 8B, the plurality of pieces of image feature data corresponding to the plurality of signal waveforms are shown as feature data Fs1 to Fsn.

As shown in FIG. 8C, the processor system 100 obtains a frequency distribution 810 for the plurality of pieces of image feature data (Fs1 to Fsn) calculated at the plurality of locations in the reference region 71. The processor system 100 calculates the statistical value Ss of the image feature data Fs based on the frequency distribution 810 (step S103B). Examples of the statistical value Ss include an average value (μs) and a standard deviation (σs). By such processing, the fluctuation of the image feature data caused by the local shape variation in the reference region 71 is calculated. The standard deviation Gs is a fluctuation amount of the first feature data with respect to the local shape variation of the pattern in the reference region.

[Processing Flow (1-3)]

With reference to FIG. 6 again, in step S104, the processor system 100 performs processing for each evaluation region 72 in a similar manner as the processing for the reference region 71 in step S103. Step S104 includes steps S104A and S104B. First, in step S104A, the processor system 100 calculates, from the SEM image of each evaluation region 72, signal waveforms at locations of the plurality of positions (samples) in the image in a direction (X-Z plane) perpendicular to a line pattern in the region. The processor system 100 calculates, for each signal waveform at each location, image feature data (also referred to as second image feature data) of the same type as the image feature data Fs calculated in the reference region 71. Here, the image feature data (the second feature data) calculated in the evaluation region 72 is defined as feature data Fe.

The processor system 100 calculates a statistical value (also referred to as a second statistical value) based on a plurality of pieces of image feature data Fe in the evaluation region 72. In the example of the first embodiment, the processor system 100 calculates, for example, an average value (μe) as the statistical value (the second statistical value).

In step S105, the processor system 100 calculates a cross-sectional shape index (Ie) for each evaluation region 72. The processor system 100 converts a change amount of the average value μe of the image feature data Fe calculated in the evaluation region 72 into a normalized cross-sectional shape index Ie based on the statistical value Ss calculated in the reference region 71. In other words, the processor system 100 converts a statistical value (e.g., μe) of the image feature data Fe in the evaluation region 72 by using the statistical value Ss (e.g., μs, and σs) of the image feature data Fs in the reference region 71, thereby calculating the cross-sectional shape index Ie as feature data after conversion.

The conversion is represented by the following Formula 1, for example. In Formula 1, Ie is calculated by dividing a difference between μe and μs by α×σs. In Formula 1, α is a parameter for adjusting the magnitude of the local shape variation of the reference region 71.

$$I_e = \frac{\mu_e - \mu_s}{\alpha\sigma_s} \quad \text{(Formula 1)}$$

[Distribution of Feature Data and Index]

Figures 9A, 9B:
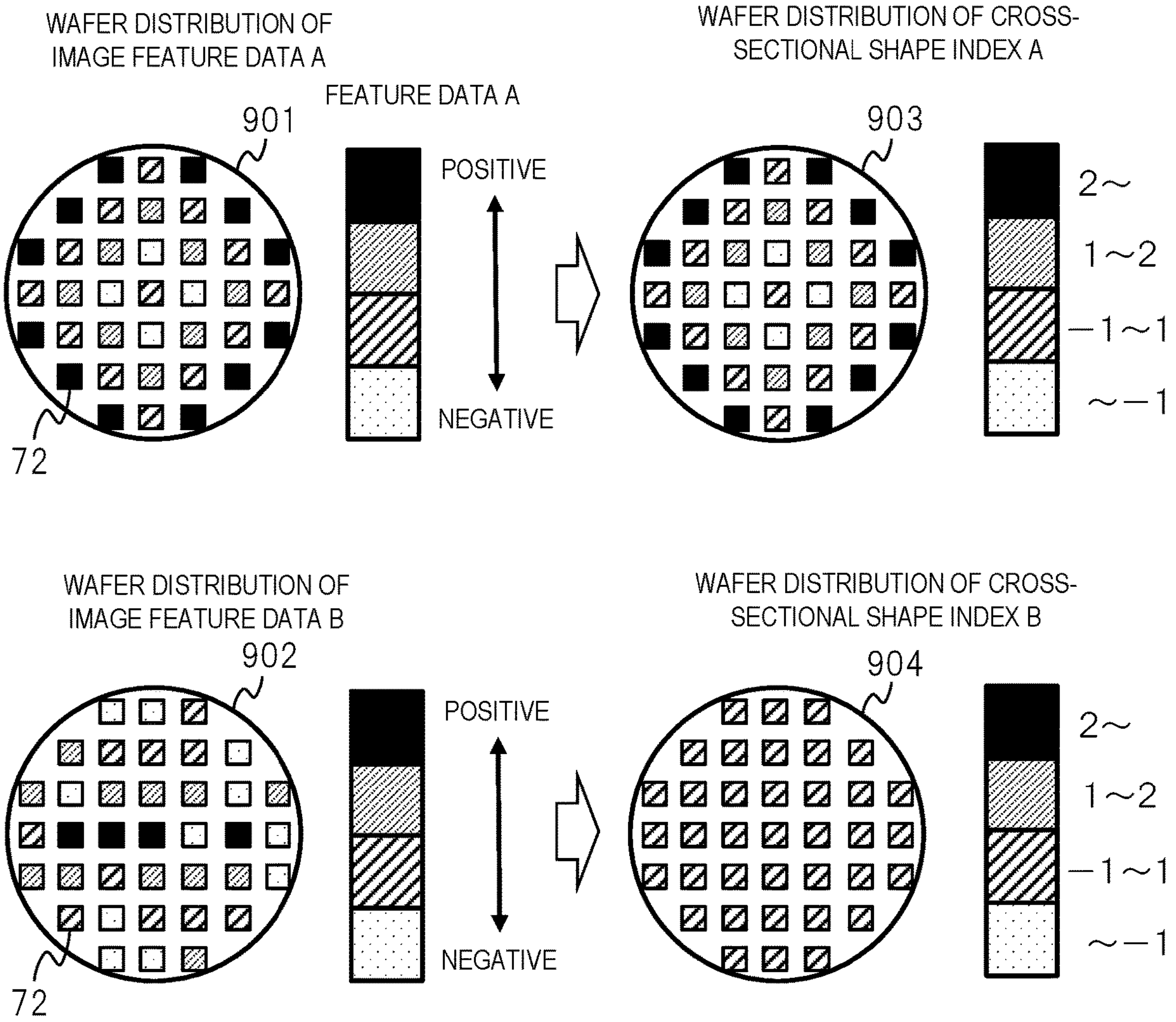
FIGS. 9A and 9B are diagrams illustrating examples of a wafer distribution of the image feature data and examples of a wafer distribution of a cross-sectional shape index according to the first embodiment.

FIGS. 9A and 9B shows examples of the feature data and the cross-sectional shape index obtained as results of processing flow in FIG. 6. FIG. 9A shows a distribution of the feature data Fe in each evaluation region 72 within a surface of the target wafer. FIG. 9A shows an example of a wafer distribution 901 of one certain type of image feature data (here, feature data A) which is calculated in each evaluation region 72 on the surface of the wafer and a wafer distribution 902 of another type of image feature data (here, feature data B) which is calculated in each evaluation region 72 on the same surface of the wafer. When these wafer distributions are displayed on the display screen, the feature data Fe in each evaluation region 72 is expressed in multi-valued colors. On a right side of each wafer distribution, a scale of the color of the feature data Fe is shown. In FIG. 9A, the feature data Fe is not expressed in the multi-valued colors but is shown as a simplified schematic diagram, for example, as a quaternary-filled pattern region. For example, on the scale shown in FIG. 9A, the closer to a dot pattern region, the larger a negative value of the feature data is, and the closer to a black region, the larger a positive value of the feature data is.

The change in image feature data represents a change in cross-sectional shape of the semiconductor pattern, but since a unit of the image feature data is not associated with the cross-sectional shape dimension, the magnitude of the change in cross-sectional shape cannot be evaluated based on the change in image feature data. In other words, it is not possible to specify what kind of change in cross-sectional shape (for example, the line width, the WB, the inclination of the side wall, the rounding, the tailing, or the like) a change in certain feature data specifically represents, and it is not possible to quantitatively evaluate the change in cross-sectional shape only based on the image feature data.

On the other hand, the semiconductor inspection system according to the first embodiment obtains the cross-sectional shape index Ie, which is an index obtained by normalizing the change amount of the image feature data based on the fluctuation of the image feature data caused by the local shape variation, for the image feature data (for example, the feature data A and the feature data B) by the processing as shown in FIG. 6. For example, FIG. 9B shows a wafer distribution 903 of a cross-sectional shape index (defined as an index A) obtained from the wafer distribution 901 of the feature data A and a wafer distribution 904 of a cross-sectional shape index (defined as an index B) obtained from the wafer distribution 902 of the feature data B. In FIG. 9B, similarly to the feature data Fe, the cross-sectional shape index Ie is not expressed in the multi-valued colors but is shown as a simplified schematic diagram, for example, as a quaternary-filled pattern region. For example, on a scale shown in FIG. 9B, the closer to a dot pattern region, the closer to −1 the index is, and the closer to a black region, the closer to +2 or more the index is. In this example, a range of values of the index Ie is normalized to a range from −1 to +2 or more, but is not limited thereto.

In FIG. 9B, the wafer distribution 903 of the cross-sectional shape index A represents, in other words, a change amount of the image feature data A with respect to the fluctuation caused by local shape variation. The wafer distribution 904 of the cross-sectional shape index B represents, in other words, a change amount of the image feature data B with respect to the fluctuation caused by local shape variation.

Examples of the results of two types of cross-sectional shape indices, that is, the cross-sectional shape index A and the cross-sectional shape index B in FIG. 9B will be compared. The wafer distribution 903 of the cross-sectional shape index A of the image feature data A indicates that a change equal to or greater than a local shape variation occurs within the surface of the wafer. In this example, a change in the index A appears from the center of the surface of the wafer toward an outer periphery in a radial direction, and, for example, black regions (index value is 2 or more) are present in the vicinity of the outer periphery. It can be quantitatively determined from the wafer distribution 903 that a change in cross-sectional shape dimension correlated with the image feature data A is caused by a change equal to or greater than the local shape variation within the surface of the wafer.

On the other hand, the wafer distribution 904 of the cross-sectional shape index B of the image feature data B indicates that only a change equal to or smaller than the local shape variation occurs. In this example, the entire surface of the wafer has regions in which the index B ranges from −1 to +1. It can be quantitatively determined from the wafer distribution 904 that a change in cross-sectional shape dimension correlated with the image feature data B is caused by only a change equal to or smaller than the local variation within the surface of the wafer.

[Effects (1)]

According to the first embodiment, it is possible to use image feature data and a cross-sectional shape index acquired based on a Top-view SEM image to quantitatively evaluate a change in cross-sectional shape of a semiconductor pattern in a non-destructive manner before the cross-sectional observation. For example, by displaying the cross-sectional shape index on the display screen and viewing the cross-sectional shape index by a user, it is possible to determine the cross-sectional observation locations on the surface of the wafer suitable for cross-sectional processing for the cross-sectional observation. Accordingly, it is possible to perform efficient cross-sectional observation, inspection, and the like at low cost.

As shown in FIG. 9B, according to the first embodiment, by using the cross-sectional shape index converted from the image feature data, it is possible to quantitatively evaluate whether a global change in cross-sectional shape equal to or greater than the local shape variation occurs on the surface of the wafer. According to the first embodiment, for example, by displaying the cross-sectional shape index for the user, it is possible to quantitatively determine whether a global change in cross-sectional shape equal to or greater than the local shape variation occurs on the surface of the wafer. According to the first embodiment, it is possible to detect a region with a large change in cross-sectional shape based on the cross-sectional shape index.

The semiconductor inspection system according to the first embodiment may display information including the cross-sectional shape index obtained in this manner together with the GUI on, for example, a display screen of a display device of the processor system 100 (or client terminal 7 or the like). Contents on the display screen may be the same as those in FIGS. 4A to 5C, and FIGS. 7 to 9B, for example. The processor system 100 may display, on the display screen, for example, an SEM image, a signal waveform, feature data, a statistical value, a frequency distribution, a cross-sectional shape index, and wafer distributions as shown in FIGS. 9A and 9B in association with one another. The processor system 100 may display, on the display screen, only information specified by the user. For example, when the user specifies the feature data A on the display screen, the processor system 100 may display, on the display screen, the wafer distribution of the feature data A and the wafer distribution of the index A as shown in FIGS. 9A and 9B. For example, when the user specifies one region from the wafer distribution of the index A on the display screen, the processor system 100 may display an SEM image and related information of the region on the display screen in an enlarged manner. When the user specifies the magnitude of an index (for example, "2 or more") on the display screen, the processor system 100 may display only a region corresponding to the magnitude of the index specified in the wafer distribution.

The processor system 100 stores, in a storage unit (a memory in the processor system 100, an external DB, or the like), various types of data and information used during the processing shown in FIG. 6 in association with one another. The various types of data and information are a target wafer, a reference region, an evaluation region, an SEM image, a signal waveform, feature data, a statistical value, a frequency distribution, a cross-sectional shape index, wafer distributions as shown in FIGS. 9A and 9B, and the like.

FIG. 10 shows an example of a table of data stored in the processor system 100. The table includes, as items, a wafer, a reference region, an evaluation region, an SEM image, a signal waveform, feature data, a statistical value, a cross-sectional shape index, and the like. The processor system 100 may display, on the display screen, data as shown in FIG. 10.

The invention is not limited to the configuration example in the first embodiment, and various modifications can be made. For example, instead of the SEM 1, other types of electron microscopes, charged particle beam devices, or the like that can capture images may be applied.

In the first embodiment, an example has been described in which the image feature data is calculated based on the signal waveforms calculated from the SEM images as shown in FIGS. 8A to 8C, but the present invention is not limited thereto. As the image feature data, feature data calculated from a two-dimensional image without calculating a signal waveform may be used. For example, the image feature data may be feature data obtained by performing Fourier transform on an SEM image.

In the first embodiment, an example has been described in which the reference region 71 and the evaluation regions 72 are set on the same wafer to evaluate the uniformity and variation of the cross-sectional shape within the surface of the wafer, but the present invention is not limited thereto. It is also possible to set the reference region 71 and the evaluation region 72 between different wafers to evaluate the uniformity and variation of the cross-sectional shape between the wafers. For example, the reference region 71 is set within a surface of a first wafer, and the evaluation region 72 is set within a surface of a second wafer. A plurality of evaluation regions may be selected from a plurality of wafers. In these cases, the processing of the first embodiment can be similarly applied.

In the first embodiment, an example has been described in which a target semiconductor pattern is a line pattern, but the present invention is not limited thereto. For example, the processing of the first embodiment can be similarly applied when the target semiconductor pattern is a pattern such as a hole. For example, when an SEM image includes an elliptical shape such as a hole, the feature data may be calculated by taking a plurality of locations (samples) from the hole in a direction in which cross-sectional observation can be performed.

In the first embodiment, an example has been described in which one line pattern is included in the SEM image, but the present invention is not limited thereto. For example, when a plurality of line patterns or the like such as periodic patterns are included in an image (in other words, in the field of view for capturing an image), the processing of the first embodiment can also be similarly applied. For example, the feature data may be calculated from a plurality of locations (samples) of the plurality of line patterns within the region.

In the first embodiment, an example has been described in which a change in cross-sectional shape of the semiconductor pattern (for example, a change in cross-section in a Z direction) is evaluated, and in addition to the change in this direction, a change in shape in a direction parallel to the surface of the wafer and the semiconductor pattern (for example, the X and Y directions) may be grasped from the SEM image captured two-dimensionally. A known technique may be applied to the change in shape in a parallel direction. Accordingly, a change in three-dimensional shape of the semiconductor pattern can be evaluated.

Second Embodiment

A semiconductor inspection system according to a second embodiment will be described with reference to FIG. 11 and subsequent drawings. A basic configuration of the second embodiment is the same as or similar to that of the first embodiment. Hereinafter, configuration portions in the second embodiment different from those of the first embodiment will be mainly described.

In the semiconductor inspection system according to the second embodiment, an observation position of a cross-sectional shape of a sample (a cross-sectional observation region corresponding to the observation position) is selected based on a cross-sectional shape index obtained as in the first embodiment. Then, in the second embodiment, the selected observation position is automatically observed by the cross-sectional observation device 2 in FIG. 1. The cross-sectional observation device 2 performs cross-sectional processing on the observation position of the wafer to form a cross-section in which cross-sectional observation can be performed, and an image of the cross-section is captured and observed. A user operates the cross-sectional observation device 2 to observe the cross-section on a display screen.

In the second embodiment, a suitable position and region in which a change in cross-sectional shape is assumed are selected based on the cross-sectional shape index. Accordingly, it is possible to reduce overlooking of the change in cross-sectional shape and duplicate observation of similar changes. As compared with a case where a plurality of positions and regions on a surface of the wafer are comprehensively examined in order or a case where the plurality of positions and regions on the surface of the wafer are examined in a random manner in the related art, in the second embodiment, the cross-sectional observation can be performed sequentially from the suitable observation position. Therefore, according to the second embodiment, the number of locations on which the cross-sectional processing is performed and the number of times of the processing can be reduced, and it is possible to perform efficient evaluation and inspection.

[Semiconductor Inspection System]

A system similar to that shown in FIG. 1 can be applied to a configuration of the semiconductor inspection system according to the second embodiment. In the second embodiment, the SEM 1 (including the processor system 100) and the cross-sectional observation device 2 shown in FIG. 1 are mainly used. Characteristic processing (that is, processing for selecting a cross-sectional observation region) in the second embodiment is mainly performed by the processor system 100. The semiconductor inspection system according to the second embodiment includes an external input unit that inputs cross-sectional observation conditions based on an operation of the user. As the external input unit, the input device 205 or the output device 206 shown in FIG. 2, the external input unit 104 shown in FIG. 3, the client terminal 7 shown in FIG. 1, or the like can be applied. The semiconductor inspection system according to the second embodiment includes an output unit that outputs, to the user, information including the selected cross-sectional observation position and region. As the output unit, the output device 207 shown in FIG. 2, the display unit 107 shown in FIG. 3, the client terminal 7 shown in FIG. 1, or the like can be applied. In the example of the second embodiment, the information including the selected cross-sectional observation position and region is displayed along with the GUI on a display screen of the output device 207 shown in FIG. 2.

The cross-sectional observation device 2 is, for example, an FIB-SEM, and is a device that can be used for performing the cross-sectional processing and the cross-sectional observation. The cross-sectional observation device 2 is used to perform the cross-sectional observation on the cross-sectional observation region selected by the processor system 100.

As a modification, a functional part that performs processing for selecting the cross-sectional observation region may be mounted on a device other than the processor system 100 of the SEM 1 shown in FIG. 1. The functional part may be mounted on the cross-sectional observation device 2. A cross-sectional observation position selection system in which the functional part is mounted on the communication network 9 may be independently provided.

[Processing Flow (2-1)]

Figure 11:
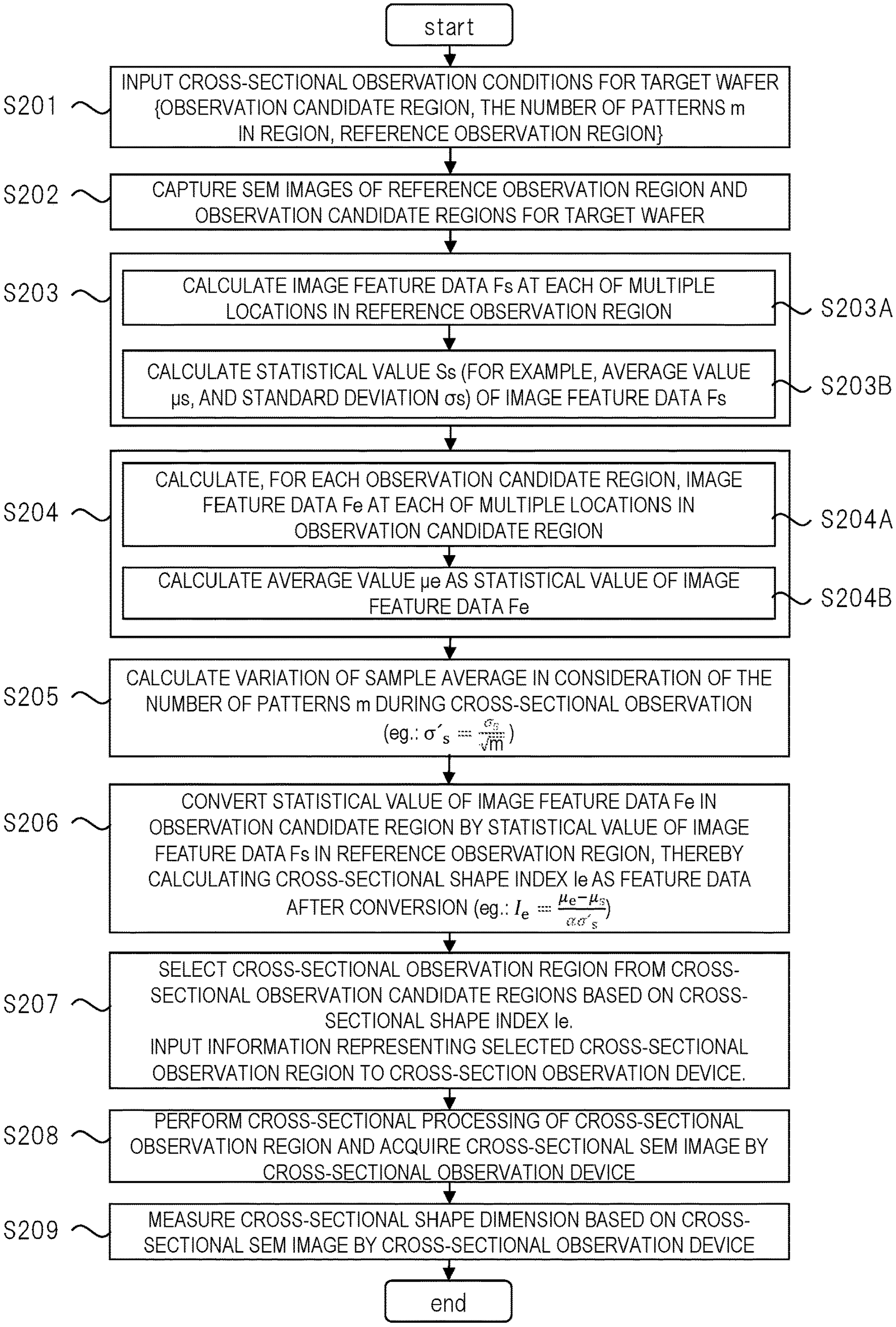
FIG. 11 is a diagram showing a processing flow in a semiconductor inspection system according to a second embodiment.

FIG. 11 shows a processing flow for quantitatively evaluating a cross-sectional shape dimension on a surface of the wafer in the semiconductor inspection system (in particular, the processor system 100) according to the second embodiment. The processing flow includes a step of selecting the cross-sectional observation position and region based on the cross-sectional shape index, a step of performing cross-sectional observation on the selected cross-sectional observation region and measuring the cross-sectional shape dimension, and the like.

In step S201, the processor system 100 inputs cross-sectional observation conditions based on the external input unit and the operation of the user. The cross-sectional observation conditions may be set in advance. In this example, as the cross-sectional observation conditions, a cross-sectional observation candidate region on the surface of the target wafer, the number of patterns (m) for performing cross-sectional observation in the region, and a reference observation region are input.

[Cross-sectional Observation Candidate Region and Reference Observation Region]

Figure 12:
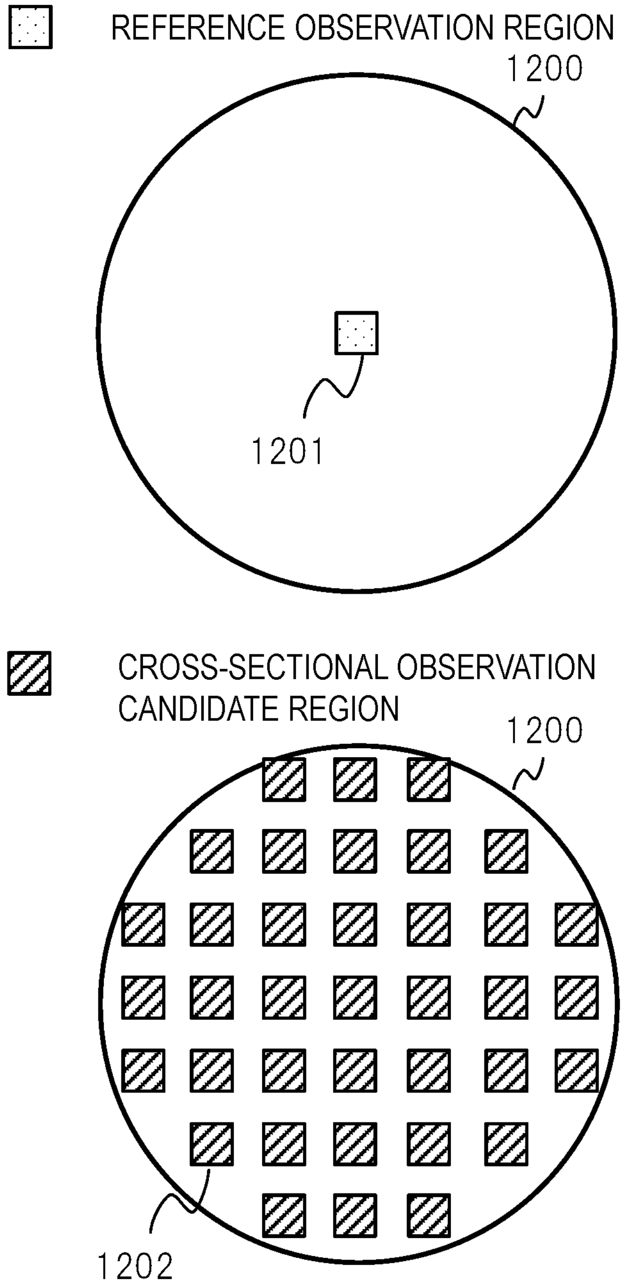
FIG. 12 is a diagram illustrating an example of a reference observation region and cross-sectional observation candidate regions according to the second embodiment.

FIG. 12 shows an example of a cross-sectional observation candidate region and a reference observation region. In the example of FIG. 12, a reference observation region 1201 is set at a center of a target wafer 1200. A plurality of cross-sectional observation candidate regions 1202 are set in a surface of the target wafer 1200. The user can set these regions as desired. Concepts of the reference observation region 1201 and the cross-sectional observation candidate regions 1202 in the second embodiment are similar to those corresponding to the reference region 71 and the evaluation regions 72 in the first embodiment, respectively. The target wafer is one or more samples as in the first embodiment.

Each cross-sectional observation candidate region 1202 is a candidate region for evaluating a global change in cross-sectional shape on the surface of the target wafer 1200. The cross-sectional observation candidate region 1202 is set for each chip, for example. The reference observation region 1201 is selected as an observation location that the user definitely wants to acquire regardless of a distribution of the cross-sectional shape index. The cross-sectional observation candidate region 1202 is compared with the reference observation region 1201. A range (in other words, an image size) of the reference observation region 1201 is set so as to cover the local shape variation of the semiconductor pattern. In a specific example, this range is set as a region including at least one line pattern, for example, as described above. In general, in the semiconductor wafer, since processing conditions are determined based on the center of the wafer, cross-sectional observation is performed at a location of the center of the wafer. Therefore, in this example, the center of the wafer is set as the reference observation region 1201.

[Processing Flow (2-2)]

With reference to FIG. 11 again, in step S202, the processor system 100 controls the SEM 1 to capture Top-view SEM images of the reference observation region 1201 and the cross-sectional observation candidate regions 1202 of the target wafer.

In step S203, the processor system 100 calculates, from the SEM image captured in the reference observation region 1201, image feature data Fs corresponding to signal waveforms at a plurality of locations (samples) in the image (step S203A). The processor system 100 calculates, for example, an average value μs and a standard deviation σs as a statistical value Ss based on the image feature data Fs (step S203B).

In step S204, similarly, the processor system 100 calculates, as feature data of the same type as the image feature data Fs calculated from the reference observation region 1201, image feature data Fe corresponding to the signal waveforms at a plurality of locations (samples) in the Top-view SEM image captured for each of the observation candidate regions 1202 from the image (step S204A). The processor system 100 calculates, for example, an average value μe as a statistical value based on the image feature data Fe (step S204B).

In step S205, assuming that the cross-sectional observation is performed on m patterns under the conditions input in step S201, the processor system 100 calculates a standard deviation σ's of a sample average distribution corresponding to the m patterns with respect to the standard deviation as calculated in the reference observation region 1201.

Figure 13A:
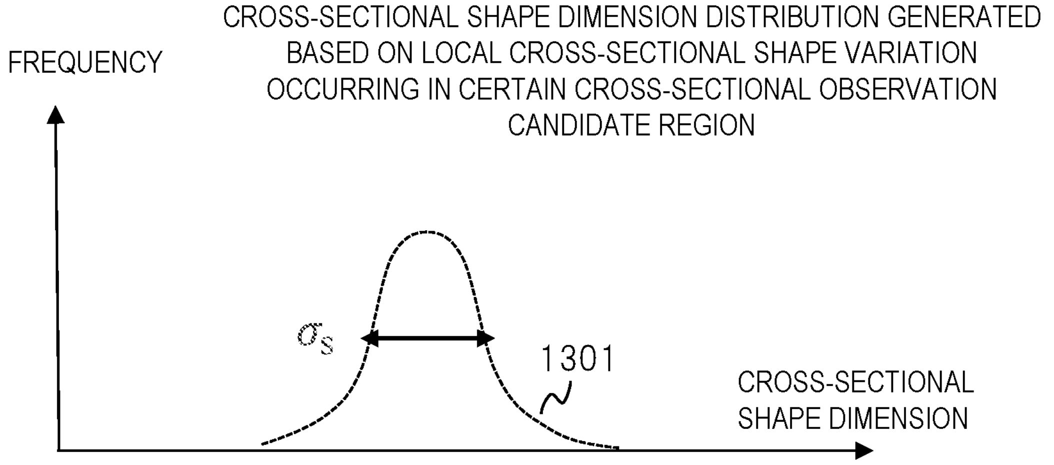
FIGS. 13A and 13B are diagrams respectively illustrating a frequency distribution of cross-sectional shape dimensions based on a local cross-sectional shape variation and a frequency distribution of sample averages when the number of patterns is m in the cross-sectional observation candidate region according to the second embodiment.
Figure 13B:
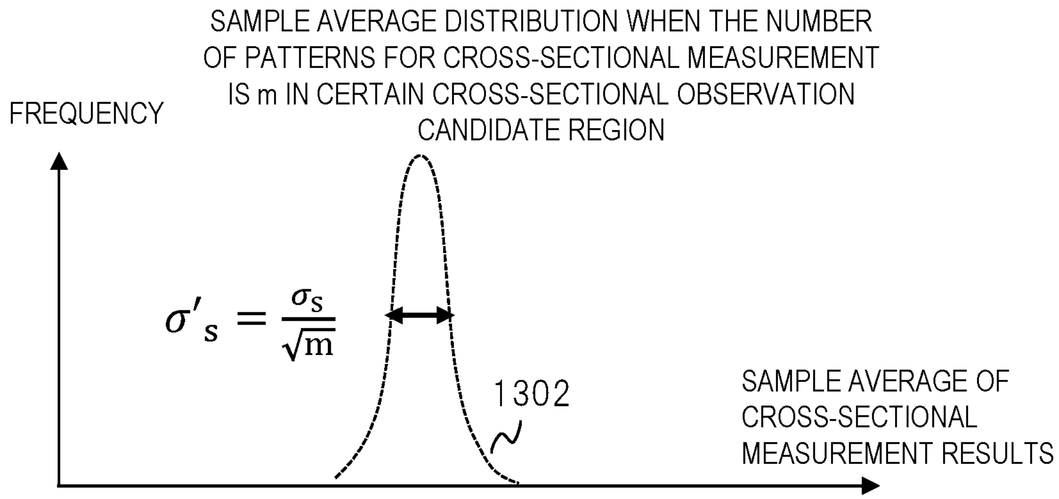

The standard deviation σ's of the sample average distribution corresponding to the m patterns is calculated by the following Formula 2 according to a central limit theorem as shown in FIGS. 13A and 13B.

$$\sigma_s' = \frac{\sigma_s}{\sqrt{m}} \quad \text{(Formula 2)}$$

FIG. 13A shows a cross-sectional shape dimension distribution 1301 generated based on a local cross-sectional shape variation occurring in a certain cross-sectional observation candidate region. A horizontal axis represents the cross-sectional shape dimension, and a vertical axis represents the frequency. The standard deviation as represents the local cross-sectional variation. FIG. 13B shows a sample average distribution 1302 when the number of patterns for cross-sectional measurement is m in the same cross-sectional observation candidate region. A horizontal axis represents a sample average of cross-sectional measurement results, and a vertical axis represents the frequency.

With reference to FIG. 11 again, in step S206, the processor system 100 converts the feature data Fe calculated in the cross-sectional observation candidate region 1202 into the cross-sectional shape index Ie by using the statistical values (μs and σ's) calculated based on the feature data Fs calculated in the reference observation region 1201. In the example of the second embodiment, the cross-sectional shape index Ie is calculated by conversion according to the following Formula 3.

$$I_e = \frac{\mu_e - \mu_s}{\alpha\sigma_s'} \quad \text{(Formula 3)}$$

[The Number of Patterns]

Figure 14A:
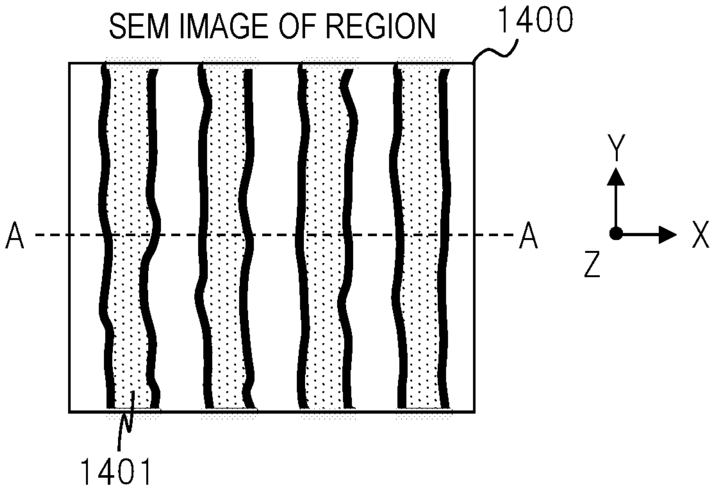
FIGS. 14A to 14C are illustrative diagrams regarding the number of patterns m in the second embodiment.
Figure 14B:
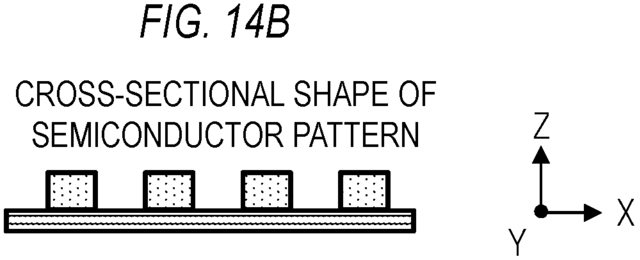
Figure 14C:
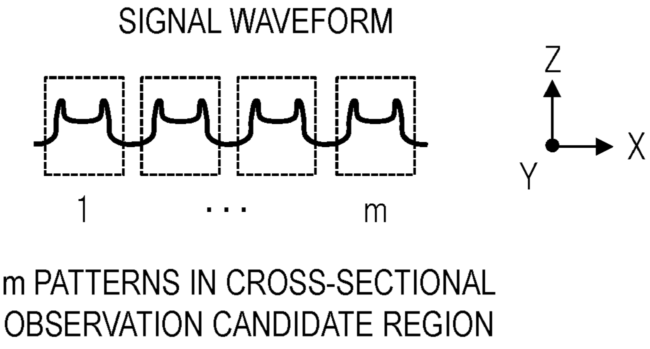

FIGS. 14A to 14C are diagrams for supplemental description of the number of patterns m in the region. FIG. 14A is an example of an SEM image 1400 of the cross-sectional observation candidate region 1202 in FIG. 12. The SEM image 1400 includes a plurality of (four in the shown example) line patterns 1401. FIG. 14B shows an X-Z cross-sectional diagram of cross-sectional shapes of semiconductor patterns corresponding to an A-A line in FIG. 14A. FIG. 14C shows an example of signal waveforms corresponding to FIGS. 14A and 14B. FIG. 14C illustrates m (m=4 in this example) patterns in the cross-sectional observation candidate region 1202 with respect to the signal waveforms. The number of patterns m in the cross-sectional observation candidate region 1202 is obtained by setting the number of patterns to be considered during actual cross-sectional observation, and is reflected in calculation of the cross-sectional shape index Ie.

[Cross-Sectional Shape Index]

Figure 15A:
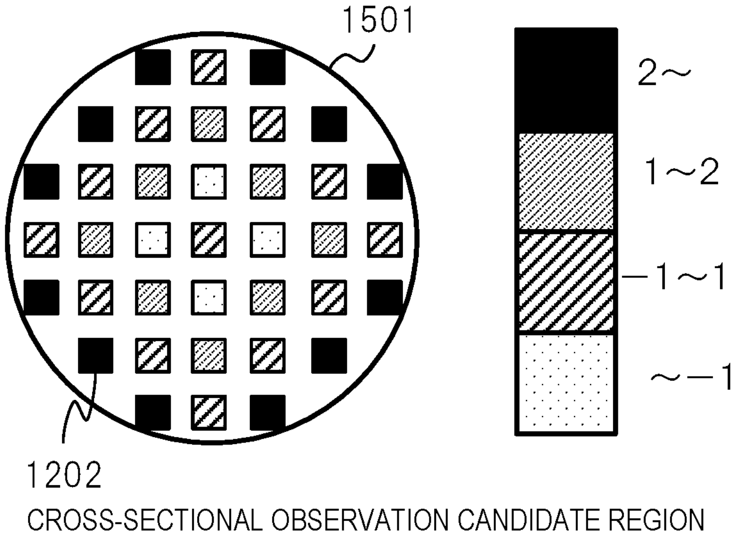
FIGS. 15A and 15B are diagrams illustrating an example of a wafer distribution of cross-sectional shape indices calculated in the cross-sectional observation candidate regions according to the second embodiment.
Figure 15B:
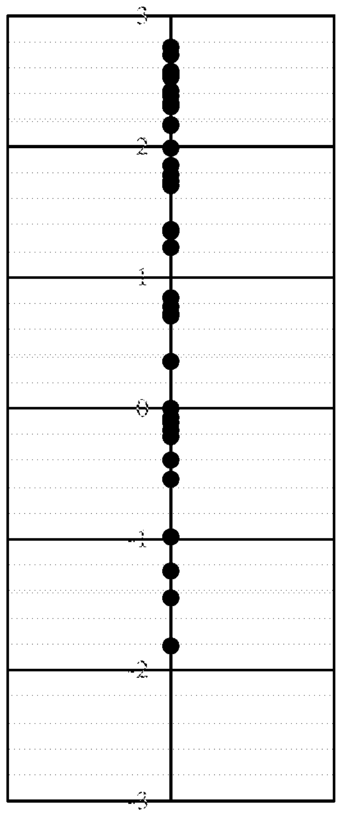

FIGS. 15A and 15B show an example of the cross-sectional shape index Ie calculated in the processing up to step S206 in FIG. 11. FIG. 15A on a left side shows a wafer distribution 1501 of the cross-sectional shape index Ie (referred to as the index A) based on certain image feature data (referred to as the feature data A) for the target wafer. The wafer distribution 1501 represents a change amount of the feature data A with respect to the fluctuation caused by the local shape variation. In the wafer distribution 1501, each cross-sectional observation candidate region 1202 has the index A with multiple values. FIG. 15A also shows a simplified schematic diagram in which the index A has four values. A range of index A is, for example, from −1 to 2 or more.

FIG. 15B on a right side shows details of the cross-sectional shape index Ie (the index A). The values of index A are distributed in a range from about −2 to about +3 in this example. The index A functions as a scale that enables quantitative evaluation by the normalization described above.

With reference to FIG. 11 again, in step S207, the processor system 100 selects and determines a cross-sectional observation region from the cross-sectional observation candidate regions 1202 based on the calculated cross-sectional shape index Ie. The cross-sectional observation region is a region to be subjected to the cross-sectional observation actually performed by using the cross-sectional observation device 2. In step S207, it is an object to calculate and select a cross-sectional observation position for efficiently observing and evaluating the cross-section by using the cross-sectional observation device 2 without overlooking a change in cross-sectional shape on the surface of the target wafer and without waste. Therefore, in the second embodiment, the cross-sectional observation region is calculated based on the cross-sectional shape index Ie from the following two viewpoints.

A first viewpoint is as follows. The cross-sectional shape index Ie represents a change in cross-sectional shape. Therefore, a first condition is to select a cross-sectional observation region from the plurality of cross-sectional observation candidate regions 1202 so as to cover a range of this change. Accordingly, it is possible to avoid overlooking a change in cross-sectional shape occurring on the surface of the wafer.

A second viewpoint is as follows. A difference in the change in cross-sectional shape equal to or smaller than the local shape variation (for example, the example of the wafer distribution 904 of the index B in FIG. 9B described above) cannot be evaluated by the cross-sectional observation. Therefore, a second condition is to select a cross-sectional observation region such that the change is equal to or greater than the local shape variation between the cross-sectional observation regions selected based on the cross-sectional shape index Ie. Accordingly, it is possible to prevent regions having the same cross-sectional shape from being observed in a duplicated manner.

[Selection of Cross-Sectional Observation Region]

Figure 16A:
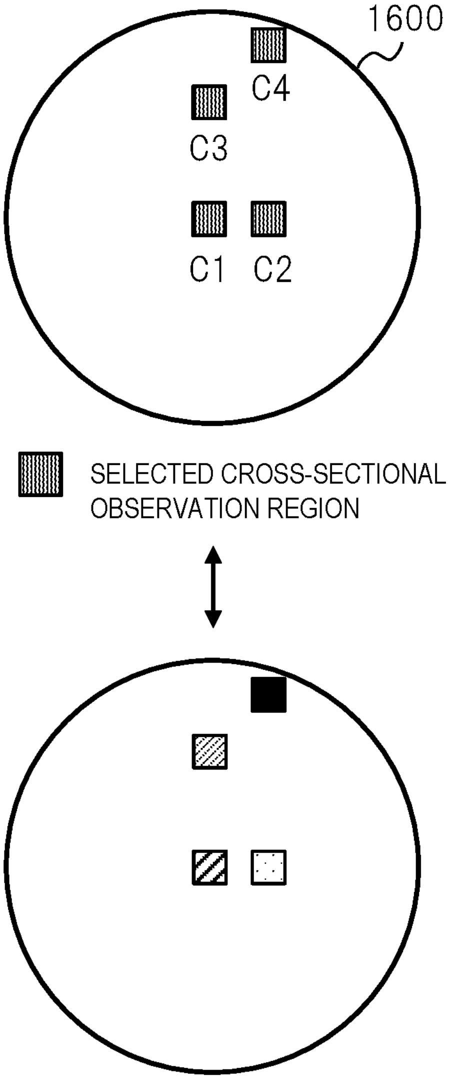
FIGS. 16A and 16B are diagrams illustrating a map representing selected cross-sectional observation regions and cross-sectional shape indices according to the second embodiment.
Figure 16B:
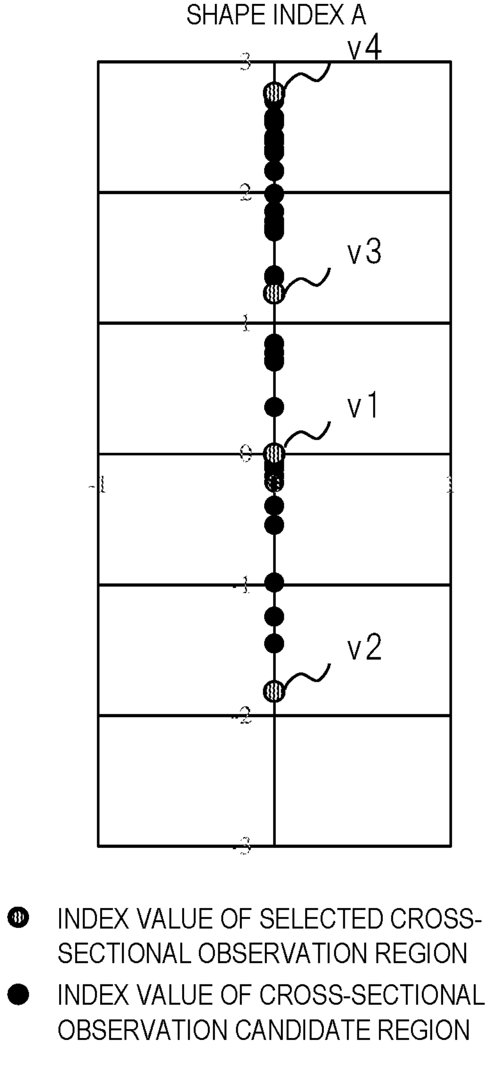

FIGS. 16A to 16B show an example of cross-sectional observation regions selected based on the cross-sectional shape index Ie in FIG. 15A. FIG. 16A on a left side shows a map 1600 representing the cross-sectional observation regions selected by the processor system 100. In this example, four cross-sectional observation regions (regions C1, C2, C3, C4) within a plane of the map 1600 are selected based on the cross-sectional shape index Ie in order to satisfy the above conditions. The four regions C1 to C4 on the map 1600 correspond to four cross-sectional observation candidate regions (same as those in FIG. 15A) in a wafer distribution shown on a lower side. As shown FIG. 16A, these cross-sectional observation regions (the regions C1 to C4) are selected to cover a range of the cross-sectional shape index Ie (for example, from about −2 to about +3).

FIG. 16B on a right side shows index values corresponding to the selected cross-sectional observation regions in a scale of the cross-sectional shape index Ie (index A) similar to that on FIG. 15B on the right side. The selected index values are four index values v1, v2, v3, and v4. The index value v1 is 0, the index value v2 is about −1.8, the index value v3 is about +1.3, and the index value v4 is about +2.8.

A detailed processing example when the processor system 100 automatically selects the above four cross-sectional observation regions will be described below. A processor first selects the region C1 in which the index value v1 is 0. The region C1 is the same as the reference observation region. Next, the processor selects the region C2 corresponding to the index value v2, which is a minimum value within the range of the index A, and the region C4 corresponding to the index value v4, which is a maximum value within the range of the index A. Next, the processor selects the region C3 corresponding to the index value v3 as a region at which a difference between the index value and that in the region C1 is +1 or more. The difference between the index values being 1 or less indicates that there is only a change equal to or smaller than the local shape variation. The difference between the index values being 1 or more indicates that there is a change equal to or greater than the local shape variation.

[Processing Flow (2-3)]

With reference to FIG. 11 again, in step S207, as in the example of FIG. 16A, the processor system 100 selects a suitable cross-sectional observation region satisfying the conditions from the cross-sectional observation candidate regions based on the cross-sectional shape index Ie. The processor system 100 acquires information representing the selected cross-sectional observation regions (for example, the regions C1 to C4), as shown on the left side of FIG. 16A, such as positional coordinates within the surface of the wafer. The processor system 100 inputs the information representing the selected cross-sectional observation regions (for example, the regions C1 to C4) to the cross-sectional observation device 2 (FIB-SEM) shown in FIG. 1. In other words, the cross-sectional observation device 2 acquires such information from the processor system 100 of the SEM 1.

In step S208, the cross-sectional observation device 2 performs cross-sectional processing such that a cross-section appears at the input position coordinates of the cross-sectional observation region, and acquires a cross-sectional SEM image of the processed cross-section of the cross-sectional observation region. At this time, the cross-sectional observation device 2 acquires a cross-sectional SEM image including a plurality of (m) patterns or a plurality of (m) cross-sectional SEM images divided for each pattern according to the number of patterns m input in step S201. The cross-sectional SEM image is an image similar to the signal waveform in FIG. 14C.

In step S209, the cross-sectional observation device 2 measures a cross-sectional shape dimension using the cross-sectional SEM image.

The cross-sectional observation device 2 or the processor system 100 stores, into a memory, a database, or the like, various types of data and information obtained during the processing shown in FIG. 11 in association with one another, and displays the data and the information together with the GUI on the display screen (the same as in the first embodiment) for the user. For example, the user can view and confirm an observation candidate region, a reference observation region, the number of patterns m in the region, an SEM image, feature data, a statistical value, a cross-sectional shape index, the selected cross-sectional observation region, a cross-sectional SEM image, a cross-sectional shape dimension, and the like on the display screen. The display screen may be the same as those in FIGS. 15A and 15B and FIGS. 16A and 16B.

[Effects (2)]

As described above, according to the second embodiment, since the suitable cross-sectional observation region is selected based on the cross-sectional shape index, the cross-sectional observation can be performed by using the cross-sectional observation device 2 efficiently without overlooking a change in cross-sectional shape on the surface of the wafer and without waste.

As a modification of the processing in FIG. 11 according to the second embodiment, the following may be performed. The processor calculates, for each cross-sectional observation candidate region, the feature data Fe from the signal waveforms calculated at a plurality of locations (samples) in the region, as in the first embodiment (FIG. 8). The processor may also calculate the average value μe and the standard deviation σe as the statistical value Ss on a cross-sectional observation candidate region side from a distribution of the feature data Fe, and use the statistical value Ss for conversion to the cross-sectional shape index Ie. In the case of the modification, the processor calculates the cross-sectional shape index Ie by using the statistical values of both the reference observation region and the cross-sectional observation candidate regions, for example, according to the following Formula 4. In Formula 4, Ie is calculated by dividing a difference between μe and μs by a sum of σe and σs.

$$I_e = \frac{\mu_e - \mu_s}{\alpha(\sigma_e + \sigma_s)} \quad \text{(Formula 4)}$$

The cross-sectional shape index Ie in Formula 4 represents a statistical degree of separation between a frequency distribution of image feature data in a cross-sectional observation candidate region and a frequency distribution of image feature data in a reference observation region. In the case of this index, since a local shape variation of the cross-sectional observation candidate region is also taken into consideration, the index can be applied even when the shape variation is greatly different between the reference observation region and the cross-sectional observation candidate region. Formula 4 according to this modification is similarly applicable to the first embodiment (step S104).

In the second embodiment, an example has been described in which the processor automatically calculates and selects the cross-sectional observation region using the cross-sectional shape index in step S207 of calculating and selecting the cross-sectional observation region in FIG. 11. The invention is not limited thereto, and it is also possible to interactively and sequentially calculate and select cross-sectional observation regions by using input and output for the user. Such an example will be described below.

[Interactive Cross-Sectional Observation]

For example, the processor system 100 calculates, by using the cross-sectional shape index Ie shown in FIGS. 15A and 15B, a cross-sectional observation candidate region having a change equal to or greater than a local shape variation with respect to the reference observation region 1201 and a cross-sectional observation candidate region only having a change equal to or smaller than the local shape variation with respect to the reference observation region 1201. Thus, for example, an auxiliary map 1700 for selecting a cross-sectional observation region as shown in FIG. 17 is obtained.

The auxiliary map 1700 in FIG. 17 shows an example of a first type candidate region indicated by a black square, a second type candidate region indicated by a white square, and the reference observation region on a surface corresponding to the wafer. The first type candidate region is a cross-sectional observation candidate region in which a change equal to or greater than the local shape variation is observed with respect to the reference observation region. The second type candidate region is a cross-sectional observation candidate region in which only a change equal to or smaller than the local shape variation is observed with respect to the reference observation region. That is, in this example, the plurality of cross-sectional observation candidate regions are roughly divided into two types of candidate regions according to the magnitude of the index.

When the cross-sectional observation candidate region (the first type candidate region) having a change equal to or greater than the local shape variation is observed as a cross-sectional observation region, a difference from the reference observation region can be evaluated. Therefore, in the modification, the processor system 100 displays such an auxiliary map 1700 together with the GUI on the display screen. The user views the auxiliary map 1700 and selects, for example, one cross-sectional observation region from the cross-sectional observation candidate regions (first type candidate regions) each having a change equal to or greater than the local shape variation.

Next, similarly, the processor system 100 calculates, by using the cross-sectional shape index Ie, a cross-sectional observation candidate region (a first type candidate region) having a change equal to or greater than the local shape variation and a cross-sectional observation candidate region (a second type candidate region) only having a change equal to or smaller than the local shape variation with respect to two regions including the cross-sectional observation region selected by the user and the reference observation region. Then, the processor system 100 similarly displays an auxiliary map including these regions. The user can select a next cross-sectional observation region by viewing the updated auxiliary map. With a configuration in which such processing and operations are sequentially repeated, it is possible to select a suitable cross-sectional observation region so as to satisfy the above two viewpoints.

The above modification may be performed as follows. The processor system 100 sequentially selects one cross-sectional observation region one by one. The processor system 100 or the user first selects, for example, one cross-sectional observation region (referred to as a first region) based on the cross-sectional shape index. The processor system 100 causes the cross-sectional observation device 2 to perform cross-sectional processing on the first region for cross-sectional observation. The user observes a cross-section of the first region. Next, when the user desires to observe a cross-section of another region, the user causes the processor system 100 to select a next cross-sectional observation region (referred to as a second region). In that case, the initial first region can also be set as the reference observation region. The processor system 100 or the user selects the second region, and causes the cross-sectional observation device 2 to perform cross-sectional processing on the second region for cross-sectional observation. The user observes a cross-section of the second region. Similarly, a cross-sectional observation region is sequentially selected as necessary for a next cross-sectional observation. Accordingly, it is possible to perform an operation of the cross-sectional observation by minimizing the cross-sectional processing that requires destruction of a part of a sample.

In the second embodiment, a case in which one cross-sectional shape index (for example, the index A) is used has been described as an example. The invention is not limited thereto, and it is also possible to use a plurality of cross-sectional shape indices corresponding to a plurality of types of feature data. When a change in the plurality of independent cross-sectional shape indices occurs on the surface of the wafer, a cross-sectional observation region may be selected so as to cover a range of the change in each cross-sectional shape index. As a processing example, in the flow of FIG. 11, steps S203 to S206 may be repeated for each type of feature data and index to calculate each index, and in step S207, a cross-sectional observation region may be selected for each index. Alternatively, in step S207, a cross-sectional observation region may be selected in consideration of the plurality of indices in a comprehensive manner.

In other modifications, when there are a plurality of cross-sectional shape indices that independently change on the surface of the wafer, the processor may compare these indices, automatically select an index in which a change within the surface of the wafer is larger than the local shape variation, and select a cross-sectional observation region for the selected index. Since the plurality of indices are normalized, such comparison is also possible.

In the second embodiment, an example of a system has been described in which automatic cross-sectional observation and cross-sectional shape dimension measurement can be performed by connecting the SEM 1 and the FIB-SEM which is the cross-sectional observation device 2, as shown in FIG. 1. The invention is not limited thereto, and the following modification is also possible without using the FIB-SEM. The processor system 100 of the SEM 1 calculates and selects a cross-sectional observation region. The user manually performs cross-sectional processing on the cross-sectional observation region using any cross-sectional processing device (for example, a polishing device). The processed cross-section is observed by a cross-sectional observation device such as a cross-sectional SEM or a STEM (a device that does not have a cross-sectional processing function but has a cross-sectional observation function). Accordingly, a change in cross-sectional shape of a semiconductor pattern can be grasped as in the second embodiment.

In the second embodiment, it is possible to associate a result obtained by measuring the cross-sectional shape dimension of the cross-sectional SEM image by the cross-sectional observation device 2 in step S209 in FIG. 11 with a cross-sectional shape index or the like calculated by the SEM 1 in order to select a cross-sectional observation region. A device such as the SEM 1 or the cross-sectional observation device 2 can store the data and information into a database or the like in association with one another, and can use the stored data and information as desired.

The data and information obtained as results according to the second embodiment can also be used in the cross-sectional shape estimation system 3 shown in FIG. 1. The cross-sectional shape estimation system 3 has a function of estimating a cross-sectional shape dimension using image feature data calculated from a Top-view image acquired by the SEM 1. The cross-sectional shape estimation system 3 includes a cross-sectional shape estimation unit that estimates a cross-sectional shape dimension. The cross-sectional shape estimation unit can be implemented by a computer system. The cross-sectional shape estimation system 3 associates a cross-sectional shape of a semiconductor pattern stored in a database 3*a* in advance with the image feature data calculated from the Top-view SEM image. The cross-sectional shape estimation system 3 is a system that estimates a cross-sectional shape dimension based on the image feature data according to a relation between the cross-sectional shape and the image feature data.

Therefore, in the modification, the data and information which are the results according to the second embodiment and in which the cross-sectional shape dimension is associated with the cross-sectional shape index are added and registered in the database 3*a* of the cross-sectional shape estimation system 3 (data and information in which the cross-sectional shape is associated with the image feature data). In other words, the database 3*a* stores data and information in which the image feature data, the cross-sectional shape index, and the cross-sectional shape dimension are associated with one another. Accordingly, in the cross-sectional shape estimation system 3, it is possible to efficiently create the database 3*a* covering a change in cross-sectional shape of the semiconductor pattern. In other words, based on the function in the second embodiment, it is possible to efficiently create information of the database 3*a* used for learning for estimation in the cross-sectional shape estimation system 3. Accordingly, accuracy of cross-sectional shape estimation based on the database 3*a* can be improved.

At this time, in step S207 shown in FIG. 11, when the plurality of indices are used, a cross-sectional observation region may be selected in consideration of the following viewpoint in addition to the above-described two viewpoints. That is, the viewpoint is to obtain regions that change independently such that there is no correlation between the plurality of cross-sectional shape indices, in other words, the correlation is as small as possible, for construction of the database 3*a*. Information on the plurality of cross-sectional observation regions selected corresponding to the plurality of independent indices or the like is registered in the database 3*a*. Accordingly, the cross-sectional shape estimation system 3 can perform efficient learning using such uncorrelated information.

Third Embodiment

A semiconductor inspection system according to a third embodiment will be described with reference to FIG. 18. The semiconductor inspection system according to the third embodiment is a system having a function of controlling (in other words, adjusting or the like) a manufacturing parameter of a semiconductor device based on image feature data of an SEM image.

The cross-sectional shape index Ie which is obtained by converting the image feature data and described in the first embodiment is an index indicating a global change on a surface of the wafer with respect to a local shape variation, and is an index quantitatively indicating the uniformity of a cross-sectional shape on the surface of the wafer. In the third embodiment, the manufacturing parameter is controlled using the cross-sectional shape index Ie.

[Manufacturing Parameter Control System]

The system shown in FIG. 1 can be similarly applied as the semiconductor inspection system according to the third embodiment. In the third embodiment, in particular, the SEM 1, the manufacturing parameter control system 4, and the semiconductor device manufacturing apparatus 5 are used. The manufacturing parameter control system 4 includes a manufacturing process parameter adjustment unit. The manufacturing process parameter adjustment unit is implemented by processing of a processor or the like. The manufacturing process parameter adjustment unit is a part that performs processing for adjusting the manufacturing parameter of a manufacturing process. In the third embodiment, an input and output unit that inputs a cross-sectional shape index to the manufacturing process parameter adjustment unit of the manufacturing parameter control system 4 is provided. As the input and output unit, the processor system 100, the input device 205, the output device 206, the client terminal 7, or the like can be similarly applied.

The third embodiment can be seen as having a configuration in which a processor system is provided in the manufacturing parameter control system 4 shown in FIG. 1. The processor system in the manufacturing parameter control system 4 may be seen as the manufacturing process parameter adjustment unit that performs characteristic processing (that is, adjusting the control parameter based on the index) in the third embodiment. The necessary processing in the third embodiment may be seen as being performed by a plurality of processor systems implemented separately as a plurality of components such as the SEM 1 and the manufacturing parameter control system 4.

[Processing Flow]

Figure 18:
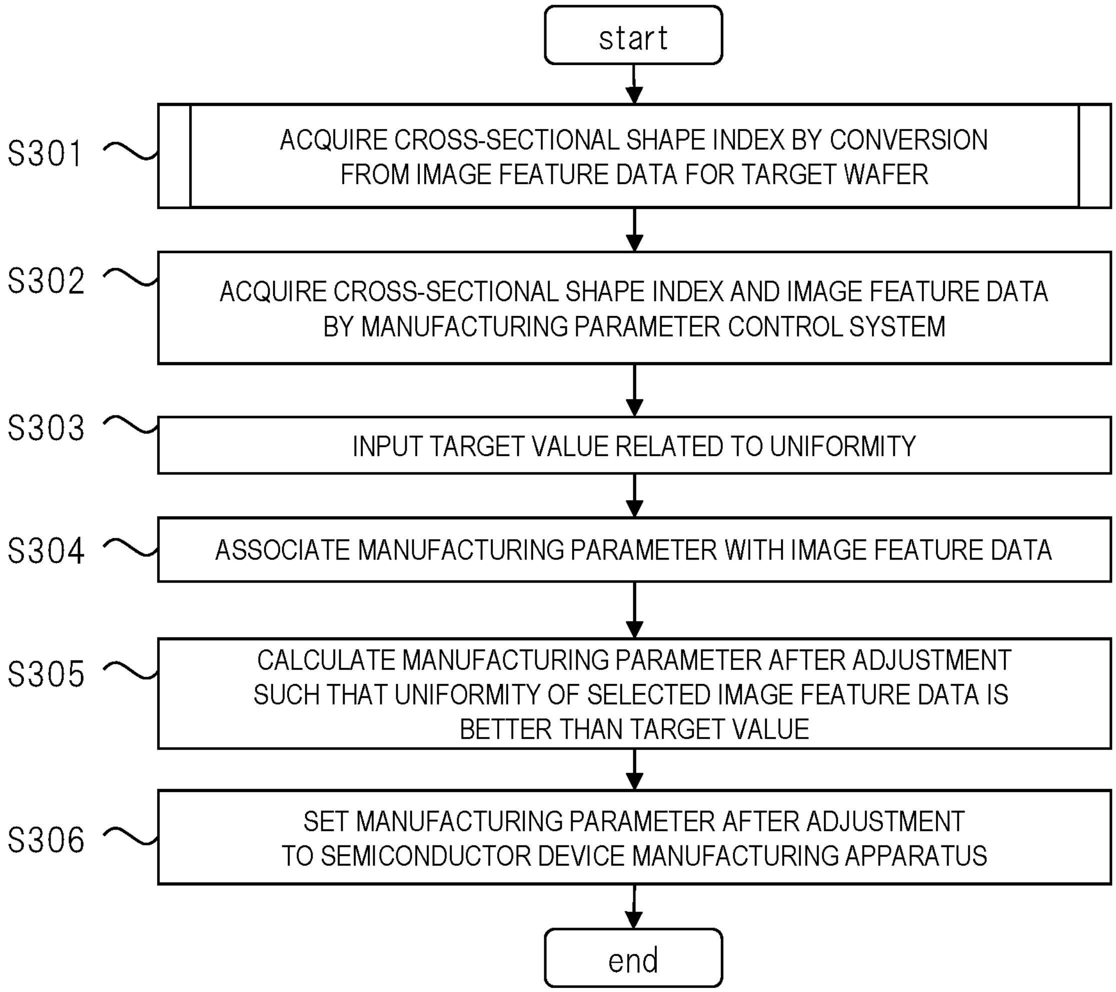
FIG. 18 is a diagram showing a processing flow in a semiconductor inspection system according to a third embodiment.

FIG. 18 shows a processing flow in the semiconductor inspection system (particularly a processor within the manufacturing parameter control system 4) according to the third embodiment. Step S301 is the same processing as the processing flow in FIG. 6 according to the first embodiment, and is processing for acquiring the cross-sectional shape index Ie converted from the image feature data of the SEM image for the target wafer. For example, a processor in the SEM 1 acquires the cross-sectional shape index Ie. Alternatively, the processor in the manufacturing parameter control system 4 may similarly calculate the cross-sectional shape index Ie based on the image acquired from the SEM 1.

Step S302 is processing for inputting the cross-sectional shape index Ie to the manufacturing parameter control system 4 through the input and output unit. In other words, the manufacturing parameter control system 4 acquires the cross-sectional shape index Ie and stores the cross-sectional shape index Ie into a memory.

In step S303, the user inputs, on a display screen provided by a system (for example, the manufacturing parameter control system 4), a target value for controlling the uniformity of a cross-sectional shape through the input and output unit. The manufacturing parameter control system 4 acquires information on the input target value and stores the information into the memory.

In step S302, the manufacturing parameter control system 4 refers to image feature data before conversion for the input cross-sectional shape index. In the first embodiment, since various types of data and information including the image feature data and the cross-sectional shape index are stored in association with one another (for example, FIG. 10), the image feature data can be obtained by referring to the data and information.

In a database 4*a* of the manufacturing parameter control system 4, information such as a manufacturing parameter related to the manufacturing of a semiconductor device in the semiconductor device manufacturing apparatus 5 is stored in advance. As the information such as the manufacturing parameter, information managed by the MES 6 may be used. Examples of the manufacturing parameter include an etching parameter when the semiconductor device manufacturing apparatus 5 is an etching device. Examples of the etching parameter include gas pressure and bias power in the case of dry etching.

In step S304, the manufacturing parameter control system 4 associates the manufacturing parameter (for example, the etching parameter) stored in the database 4*a* in advance with the image feature data.

In step S305, the manufacturing parameter control system 4 calculates a manufacturing parameter, that is, a manufacturing parameter after adjustment according to the relation between the manufacturing parameter and the image feature data, so as to satisfy a condition that the uniformity of the selected image feature data (for example, the uniformity in the surface of the wafer) is better than the input target value. At this time, the manufacturing parameter control system 4 quantitatively evaluates the uniformity based on the cross-sectional shape index. The manufacturing parameter control system 4 stores the calculated manufacturing parameter after adjustment into the memory or the database 4*a*. The adjustment of the manufacturing parameter may be performed by multiplying an original parameter value by an adjustment coefficient, but is not limited thereto.

In step S306, the manufacturing parameter control system 4 inputs the calculated manufacturing parameter after adjustment to the semiconductor device manufacturing apparatus 5 through the input the output unit. In other words, the semiconductor device manufacturing apparatus 5 receives the manufacturing parameter after adjustment, and the manufacturing parameter after adjustment is set to the semiconductor device manufacturing apparatus 5. Thereafter, the semiconductor device manufacturing apparatus 5 performs a manufacturing process (for example, an etching process) according to the manufacturing parameter after adjustment. The manufacturing parameter after adjustment may be input and set in the MES 6. The adjustment of the manufacturing parameter as described above can be repeatedly performed as appropriate.

[Effects (3)]

According to the third embodiment, the manufacturing parameter can be suitably adjusted based on the image feature data and the cross-sectional shape index, and the uniformity of the cross-sectional shape on the surface of the wafer can be improved.

In the third embodiment, the manufacturing parameter is adjusted based on the cross-sectional shape index obtained by normalizing a change amount of the image feature data with the fluctuation of the image feature data caused by the local shape variation. The invention is not limited thereto, the same applies to the cross-sectional shape estimation system 3 according to the second embodiment shown in FIG. 1.

Figure 19:
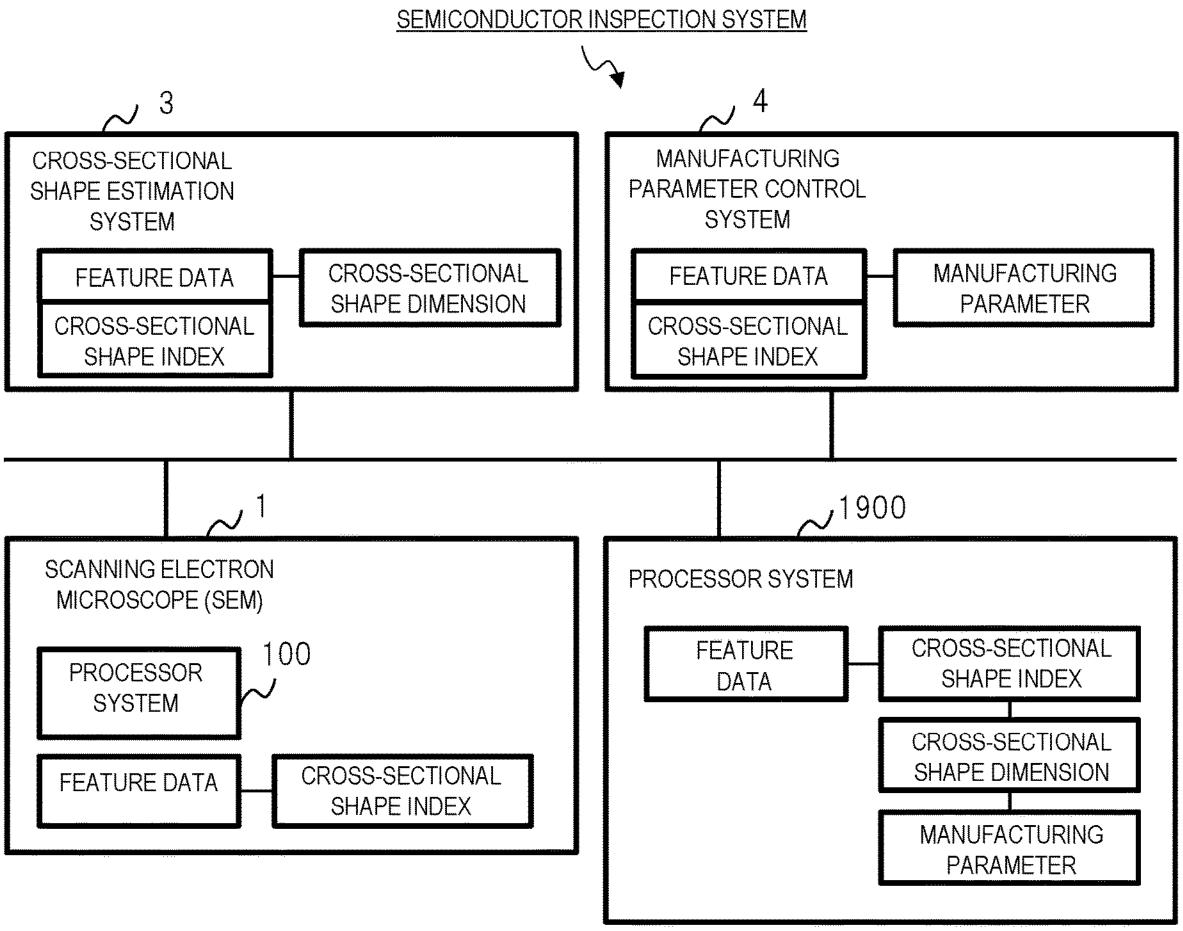
FIG. 19 is a diagram illustrating a configuration example of a system according to a modification of the third embodiment.

FIG. 19 shows a configuration of a modification in which the adjustment of the manufacturing parameter according to the third embodiment is combined with the cross-sectional shape estimation system 3 according to the second embodiment. A system according to this modification associates image feature data and a cross-sectional shape index, a cross-sectional shape (for example, a cross-sectional shape dimension), and a manufacturing parameter. In this modification, the processor adjusts the manufacturing parameter so as to improve the uniformity of a specific cross-sectional shape dimension (for example, a line width) based on a cross-sectional shape index (in other words, a cross-sectional shape dimension index) obtained by normalizing a change amount of a cross-sectional shape dimension with a local shape variation with respect to the cross-sectional shape dimension output and estimated based on the image feature data in the cross-sectional shape estimation system 3.

A configuration example of the system shown in FIG. 19 is a configuration in which the first to third embodiments are combined. First, the processor system 100 of the SEM 1 stores data and information in association with at least the feature data and the cross-sectional shape index. The cross-sectional shape estimation system 3 holds data and information in association with at least the feature data and the cross-sectional shape dimension. The manufacturing parameter control system 4 holds data and information in association with the image feature data, the cross-sectional shape index, and the manufacturing parameter.

In the example of FIG. 19, a processor system 1900 provided in any one of the systems associates the image feature data and the cross-sectional shape index, the cross-sectional shape dimension, and the manufacturing parameter. The processor system 1900 adjusts the manufacturing parameter based on the cross-sectional shape index such that the uniformity of the estimated cross-sectional shape dimension in the surface of the wafer or the like is improved. The manufacturing parameter after adjustment is set to the semiconductor device manufacturing apparatus 5. Although FIG. 19 shows an example in which the processor system 1900 is an independent system, the processor system 1900 may be implemented in the SEM 1, the cross-sectional shape estimation system 3, the manufacturing parameter control system 4, or the like.

Although the embodiments of the present disclosure have been specifically described, the present disclosure is not limited to the embodiments described above and can be variously modified without departing from the scope of the present disclosure. Except for essential components, the components of the embodiments may be added, deleted, replaced, or the like. Unless otherwise limited, each component may be singular or plural. In addition, an embodiment combining the respective embodiments is also possible.

What is claimed is:

1. A processor system for evaluating a three-dimensional shape including a cross-sectional shape of a pattern of a semiconductor which is a sample, the processor system comprising:
- at least one processor; and
- at least one memory resource, wherein
- the processor is configured to:
  - acquire one or more images captured by an electron microscope for each of one or more samples,
  - calculate, for a singular reference region defined on each surface of the one or more samples, first feature data corresponding to each of a plurality of locations in the singular reference region from the captured image,
  - calculate a first statistical value based on the first feature data at the plurality of locations,
  - calculate, for each of a plurality of evaluation regions defined on each of the surfaces of the one or more samples corresponding to the singular reference region, second feature data corresponding to each of one or more locations in the plurality of evaluation regions from the captured image, as feature data of a same type as the first feature data, and
  - convert the second feature data using the first statistical value to obtain a cross-sectional shape index,
- wherein each of the first feature data and the second feature data is at least one type of feature data among a line width, a white band peak, a bottom signal value, a top signal value, an inclination calculated based on signal waveform of the captured image, or a value that is calculated from the captured image by calculation, and
- wherein the processor is configured to:
  - store, into the memory resource, the cross-sectional shape index, a target uniformity value, the first feature data and a manufacturing parameter in association with the first feature data,
  - determine a uniformity of the one or more samples based on the cross-sectional shape index, and
  - adjust the manufacturing parameter based on the association between the manufacturing parameter and the first feature data such that the uniformity of the one or more samples is greater than the target uniformity value.

2. The processor system according to claim 1, wherein the processor is configured to:
- calculate, as the first statistical value, a fluctuation amount and an average value of the first feature data with respect to a local shape variation of a pattern in the reference region,
- calculate, as a second statistical value, an average value of the second feature data with respect to a local shape variation of a pattern in the evaluation region, and
- normalize a difference between the average value of the second feature data and the average value of the first feature data with the fluctuation amount of the first feature data.

3. The processor system according to claim 1, wherein to determine the uniformity of the one or more samples, the processor is configured to quantify and evaluate a change in cross-sectional shape of the pattern of the semiconductor in a surface of the one or more samples by using the cross-sectional shape index as an index.

4. The processor system according to claim 1, wherein
- the processor is configured to display, on a display screen, the cross-sectional shape index for the evaluation region of the one or more samples.

5. The processor system according to claim 1, wherein
- the processor is configured to select a cross-sectional observation position for cross-sectional observation based on the cross-sectional shape index.

6. The processor system according to claim 5, wherein
- the processor is configured to cause a cross-sectional observation device to perform cross-sectional observation and to measure a cross-sectional shape dimension based on the cross-sectional observation position.

7. The processor system according to claim 6, wherein
- the processor is configured to store, into the memory resource, the second feature data, the cross-sectional shape index, and the cross-sectional shape dimension in association with one another as data for at least one region region of the one or more samples.

8. The processor system according to claim 7, wherein
- the processor is configured to:
  - acquire an image captured by the electron microscope for an estimation target sample,
  - calculate feature data from the captured image, and estimate a cross-sectional shape dimension of a pattern of the estimation target sample based on the calculated feature data according to a relation between the cross-sectional shape dimension and the calculated feature data.

9. The processor system according to claim 1, wherein the processor is configured to store, into the memory resource, the second feature data, the cross-sectional shape index, a cross-sectional shape dimension as a result of cross-sectional observation, and a manufacturing parameter for the one or more samples in association with one another as data for at least one region region of the one or more samples.

10. A semiconductor inspection system for inspecting a three-dimensional shape including a cross-sectional shape of a pattern of a semiconductor which is a sample, the semiconductor inspection system comprising:

an electron microscope; and a processor system including at least one processor and at least one memory resource, wherein the processor is configured to:

acquire one or more images captured by the electron microscope for each of one or more samples, calculate, for a singular reference region defined on each surface of the one or more samples, first feature data corresponding to each of a plurality of locations in the singular reference region from the captured image, calculate a first statistical value based on the first feature data at the plurality of locations, calculate, for each of a plurality of evaluation regions defined on each of the surfaces of the one or more samples corresponding to the singular reference region, second feature data corresponding to each of one or more locations in the plurality of evaluation regions from the captured image, as feature data of a same type as the first feature data, and convert the second feature data using the first statistical value to obtain a cross-sectional shape index, wherein each of the first feature data and the second feature data is at least one type of feature data among a line width, a white band peak, a bottom signal value, a top signal value, an inclination calculated based on signal waveform of the captured image, or a value that is calculated from the captured image by calculation, and wherein the processor is configured to:

store, into the memory resource, the cross-sectional shape index, a target uniformity value, the first feature data and a manufacturing parameter in association with the first feature data, determine a uniformity of the one or more samples based on the cross-sectional shape index, and adjust the manufacturing parameter based on the association between the manufacturing parameter and the first feature data such that the uniformity of the one or more samples is greater than the target uniformity value.

11. A program for causing a processor system for evaluating a three-dimensional shape including a cross-sectional shape of a pattern of a semiconductor which is a sample, to perform processing, wherein a processor of the processor system is caused to perform the following processing:

acquiring one or more images captured by an electron microscope for each of one or more samples;

calculating, for a singular reference region defined on each surface of the one or more samples, first feature data corresponding to each of a plurality of locations in the singular reference region from the captured image;

calculating a first statistical value based on the first feature data at the plurality of locations;

calculating, for each of a plurality of evaluation regions defined on each of the surfaces of the one or more samples corresponding to the singular reference region, second feature data corresponding to each of one or more locations in the plurality of evaluation regions from the captured image, as feature data of a same type as the first feature data; and converting the second feature data using the first statistical value to obtain a cross-sectional shape index, wherein each of the first feature data and the second feature data is at least one type of feature data among a line width, a white band peak, a bottom signal value, a top signal value, an inclination calculated based on signal waveform of the captured image, or a value that is calculated from the captured image by calculation, and wherein the processor is configured to:

store, into a memory resource, the cross-sectional shape index, a target uniformity value, the first feature data and a manufacturing parameter in association with the first feature data, determine a uniformity of the one or more samples based on the cross-sectional shape index, and adjust the manufacturing parameter based on the association between the manufacturing parameter and the first feature data such that the uniformity of the one or more samples is greater than the target uniformity value.

* * * * *